(12) United States Patent
Yamamoto et al.

(10) Patent No.: US 7,665,918 B2
(45) Date of Patent: Feb. 23, 2010

(54) DEVELOPING APPARATUS, DEVELOPING METHOD AND STORAGE MEDIUM

(75) Inventors: Taro Yamamoto, Koshi (JP); Hirofumi Takeguchi, Koshi (JP); Shuichi Nagamine, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 23 days.

(21) Appl. No.: 12/173,262

(22) Filed: Jul. 15, 2008

(65) Prior Publication Data

US 2009/0033898 A1    Feb. 5, 2009

(30) Foreign Application Priority Data

Jul. 30, 2007  (JP)  ............................. 2007-197891

(51) Int. Cl.
*G03D 5/00* (2006.01)
*G03B 27/32* (2006.01)
*B05C 11/02* (2006.01)

(52) U.S. Cl. ............................ 396/611; 355/27; 118/52
(58) Field of Classification Search ................ 396/611; 355/27; 427/421.1; 118/52
See application file for complete search history.

(56) References Cited

U.S. PATENT DOCUMENTS 5,962,070 A * 10/1999 Mitsuhashi et al. ......... 427/240
6,247,479 B1 * 6/2001 Taniyama et al. .......... 134/95.2
6,371,667 B1 * 4/2002 Kitano et al. ............... 396/611

(Continued)

FOREIGN PATENT DOCUMENTS

JP    2005-210059    8/2005

OTHER PUBLICATIONS

U.S. Appl. No. 10/584,264, filed Jun. 26, 2006, Atsushi Ookouchi, et al.

*Primary Examiner*—Alan A Mathews
(74) *Attorney, Agent, or Firm*—Oblon, Spivak, McClelland, Maier & Neustadt, L.L.P.

(57) ABSTRACT

A developing apparatus includes, to process substrates each coated with a resist and processed by an exposure process by a developing process, includes: plural developing units each provided with a substrate holding device for stably pouring a developer onto the substrate, a first developer nozzle to be used in common by the plural developing units to pour the developer in a band-shaped flow onto the substrates held by each of the substrate holding devices, a nozzle driving mechanism for carrying the first developer nozzle from one to another of the developing units, and moving the first developer nozzle with one end of a band-shaped area into which the developer is to be poured through the first developer nozzle directed toward the center of the substrate in each of the developing units such that a part in a surface of the substrate onto which the developer is poured moves from a central part toward a peripheral part or from a peripheral part toward a central part in the surface of the substrate to coat the surface of the substrate entirely with a developer film, and second developer nozzles for pouring the developer into a circular area or a band-shaped area of a short length shorter than that of the band-shaped area into which the first developer nozzle pours the developer in a central part of the substrate on which the developer film has been formed by the first developer nozzle. The nozzles are used selectively for developing steps.

19 Claims, 15 Drawing Sheets

U.S. PATENT DOCUMENTS

| | | | |
|---|---|---|---|
| 6,384,894 B2 * | 5/2002 | Matsuyama et al. | 355/27 |
| 2001/0009452 A1 * | 7/2001 | Matsuyama et al. | 355/27 |
| 2006/0048792 A1 * | 3/2006 | Nakamura et al. | 134/2 |
| 2007/0177869 A1 * | 8/2007 | Yamamoto et al. | 396/611 |
| 2007/0184178 A1 * | 8/2007 | Yamamoto et al. | 427/8 |
| 2009/0130614 A1 * | 5/2009 | Ookouchi et al. | 430/434 |

* cited by examiner 22a 47a 48a 49a
(22b, 22c) (47b, 47c) (48b, 48c) (49b, 49c)

22a(22b, 22c)   63

DEVELOPING APPARATUS, DEVELOPING METHOD AND STORAGE MEDIUM

BACKGROUND OF THE INVENTION

1. Field of the Invention

The present invention relates to a developing apparatus for processing a substrate having a surface coated with a resist and processed by an exposure process, a developing method and a storage medium.

2. Description of the Related Art

A resist pattern forming process, namely, one of processes included in a semiconductor device fabricating method, forms a resist pattern by coating a surface of a semiconductor wafer (hereinafter, referred to simply as "wafer") with a photoresist film, exposing the photoresist film in a predetermined pattern, and developing the exposed photoresist film. Generally, such a resist pattern forming process is executed by a system built by connecting a coating and developing apparatus that forms a resist film on a wafer and develops the resist film, and an exposure system.

A conventional developing process holds a wafer in a horizontal position, for example, on a substrate holding device, and disposes a developer nozzle provided with small pouring holes at a position slightly above the surface of the wafer. Then, the wafer is rotated about a vertical axis and the developer nozzle is moved along a radius of the rotating wafer, pouring a developer onto the wafer. Consequently, a spiral bead of the developer is formed on the surface of the wafer. The wafer wetted with the developer is kept stationary for a predetermined developing time, and then a rinsing solution is poured onto the surface of the wafer to rinse the developer away. This developing process is called a puddle developing process.

Use of a large quantity of developer is a drawback of the puddle developing system. Studies have been made to use a developing process mentioned in JP-A 2005-210059 (Paragraph 0044 and FIG. 5) (Patent document 1) instead of the puddle developing process. The developing process mentioned in Patent document 1 pours a developer onto a rotating substrate. This known developing process will be briefly described with reference to FIGS. 15A and 15B. A spin chuck 22, namely, a substrate holding device, coaxially holding a wafer W is rotated about a vertical axis and a developer nozzle 13 provided with a pouring slit 12 and disposed with the pouring slit 12 extended from the circumference of the wafer W toward the center of the wafer W is moved from the circumference of the wafer W toward a central part of the wafer W, pouring a developer 14 in a band-shaped flow through the pouring slit 12 to supply the developer 14 in a spiral onto the surface of the wafer W so that he surface may be coated entirely with a developer film 15. After the developer nozzle 13 has been moved to the central part of the wafer W and the wafer W has been entirely coated with the developer 14, the developer nozzle 13 continues pouring the developer 14 onto the central part of the wafer W to prevent the developer film 15 from drying. In a little while a resist pattern is developed in a resist film coating the surface of the wafer W. Then, a rinsing nozzle, not shown, pours a rinsing solution onto the surface of the wafer W to rinse the developer 14 away. Thus the developing process is completed.

The developing process that forms the developer film 15 of the developer on the wafer W by pouring the developer through the developer nozzle onto the wafer W while the wafer w is rotating can reduce the time needed to complete the developing process by moving the developer nozzle 13 at a moving speed higher than that at which the developer nozzle is moved in the puddle developing process. This developing process forms the developer film of the developer 14 on the surface of the wafer W in a thickness smaller than that of a developer film formed by the puddle developing process, which is considered to be effective in reducing the consumption of the developer 14. Some resist requires narrowing a process margin to suppress the occurrence of development defects and to form lines of a resist pattern in a satisfactory CD, namely, the width of lines of a resist pattern. Consequently, in some cases, the developing time and the quantity of the used developer needed by the developing process cannot be satisfactorily reduced. Thus the reduction of the developing time and the quantity of the developer is still a problem to be solved in the developing process.

To stabilize a developed resist pattern formed by the foregoing developing method, a time between the time the wafer W is coated entirely with the developer film 15 and the time the developer film 15 is rinsed away with the rinsing solution is in the range of 10 to 20 s. The developer may be poured at a low pouring rate such that the developer film 15 does not dry during that time. If the developer 14 is poured continuously during that time at the same pouring rate as the developing process, the developer 14 cannot be satisfactorily economized.

A pouring rate at which the developer is poured through the pouring slit 12 after coating the surface of the wafer entirely with the developer film 15 can be reduced by optionally changing a developer supply rate at which the developer is supplied through a developer supply pipe 16 to the developer nozzle 13. The developer nozzle 13 is designed such that the developer is poured through parts of the pouring slit 12 respectively at longitudinally different positions at the same pouring rate and at the same pouring pressure to pour the developer in a stable band-shaped flow as mentioned above when the developer is supplied at a predetermined flow rate to the developer nozzle 13. If the developer is supplied to the developer nozzle 13 at a flow rate lower than the predetermined flow rate, the developer 14 is poured unstably through the pouring slit 12. Consequently, normal development cannot be achieved, developing defects are produced and an irregular resist pattern is formed.

Recently, studies have been made to suppress irregularities in a developing process and to simplify piping by providing a single developing apparatus with plural developing units and using the developer nozzle 13 as a common developer nozzle for all the plural developing units instead of providing a coating and developing system with plural developing apparatuses each provided with a single developing unit including a spin chuck. Suppression of the consumption of the developer is a problem also in such a developing apparatus provided with plural developing units. Although the developing process mentioned in Patent document 1 executes several developer pouring cycles, such a developing process cannot solve the foregoing problem.

SUMMARY OF THE INVENTION

The present invention has been made to solve such a problem and it is therefore an object of the present invention to provide a developing apparatus capable of stably pouring a developer for developing onto substrates coated with a resist, processed by an exposure process and held respectively by substrate holding devices of plural developing units, a developing method and a storage medium.

A developing apparatus according to the present invention includes plural transversely arranged developing units each provided with a substrate holding device for holding a substrate coated with a resist and processed by an exposure process in a horizontal position and rotating the substrate; a first developer nozzle to be used in common by the plural developing units to pour a developer in a band-shaped flow onto a substrates held by each of the substrate holding devices; a nozzle driving mechanism for carrying the first developer nozzle from one to another of the developing units, and moving the first developer nozzle with one end of a band-shaped area into which the developer is to be poured through the first developer nozzle directed toward the center of the substrate in each of the developing units such that a part in a surface of the substrate onto which the developer is poured moves from a central part toward a peripheral part or from a peripheral part toward a central part in the surface of the substrate to coat the surface of the substrate entirely with a developer film; and second developer nozzles for pouring the developer into a circular area or a band-shaped area of a short length shorter than that of the band-shaped area into which the first developer nozzle pours the developer in a central part of the substrate on which the developer film has been formed by the first developer nozzle to prevent the developer film from drying.

The plural second developer nozzles may be combined respectively with the substrate holding devices and may operate individually to supply the developer to the corresponding substrate holding devices, respectively. The first developer nozzle may be provided with a flat first outlet opening. Each of the second developer nozzles may be provided with a substantially circular outlet opening. The developing apparatus is provided with a controller, for example, for controlling the rotation of the substrate holding devices, the movement of the first developer nozzle, and pouring the developer through the first developer nozzle and the second developer nozzles. For example, the controller makes the first developer nozzle pour the developer in one of the developing units, moves the first developer nozzle to another developing unit, hold the first developer nozzle waiting in another developing unit, and then makes the first developer nozzle pour the developer onto a substrate in another developing unit.

A developing method according to the present invention includes the steps of: holding plural substrates each coated with a resist and processed by an exposure process respectively by plural substrate holding devices respectively installed in transversely arranged developing units; pouring a developer in a band-shaped flow onto either of a central and a peripheral part of a surface of the substrate held and being rotated by the substrate holding device with one end of a band-shaped area into which the developer is to be poured through the first developer nozzle directed toward the center of the substrate; forming a developer film on the surface of the substrate by moving a position on the surface of the substrate at which the developer is poured from a central part toward a peripheral part or from a peripheral part toward a central part of the surface of the substrate with one end of the band-shaped area into which the developer is poured through the first developer nozzle directed toward the center of the substrate; preventing the developer film from drying by pouring the developer through a second developer nozzle into a circular area or a band-shaped area of a short length shorter than that of the band-shaped area into which the first developer nozzle pours the developer in a central part of the substrate on which the developer film has been formed by the first developer nozzle, and rotating the substrate holding device holding the substrate about a vertical axis to spread the developer toward a circumference of the substrate by centrifugal force; moving the first developer nozzle from one to another one of the developing units; and carrying out the steps of pouring the developer and preventing a developer film from drying for the substrate held by another substrate holding device.

The plural second developer nozzles may be combined respectively with the substrate holding devices and may operate individually to supply the developer to the corresponding substrate holding devices, respectively. The developing method may include a step of holding pouring the developer through the first developer nozzle after moving the first developer nozzle completed pouring the developer onto the substrate in one of the developing units from the same developing unit to another developing unit.

A storage medium according to the present invention stores a computer program for a developing apparatus that processes a substrate coated with a resist and processed by an exposure process by a developing process to execute; wherein the computer program includes a set of instructions for carrying out the developing method.

The developing apparatus of the present invention is provided with the first developer nozzle moved from one to another one of the developing units by the driving mechanism so as to pour the developer in a band-shaped flow onto the surface of the substrate with one end of a band-shaped area into which the developer has been poured through the first developer nozzle directed toward the center of the substrate in each of the developing units to coat the surface of the substrate with a developer film, and the second developer nozzles for pouring the developer into a circular area or a band-shaped area of a short length shorter than that of the band-shaped area into which the first developer nozzle poured the developer to prevent the developer film from drying. The selective use of the developer nozzles according to the processes can suppress for pouring the developer onto a substrate to become unstable as compared with using, for example, only the first developer nozzle and changing the pouring rate at which the developer is poured through the first developer nozzle. Since the pouring rate at which the developer is poured onto the substrate can be adjusted according to the shape of the flow of the developer, the developer to be poured onto the substrate can be economized.

DESCRIPTION OF THE PREFERRED EMBODIMENTS

Figure 1:
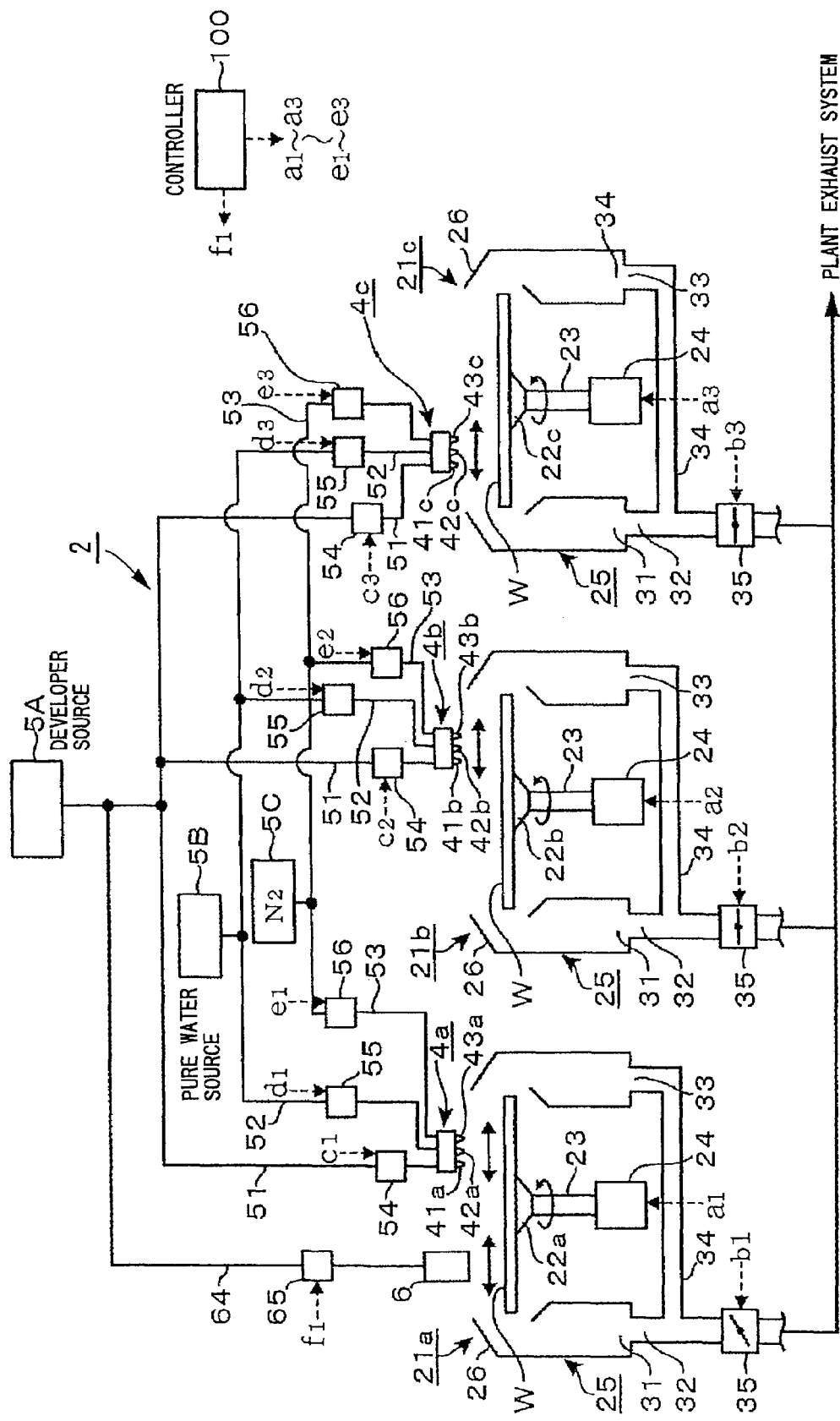
FIG. 1 is a schematic front elevation of a developing apparatus in a preferred embodiment according to the present invention.

A developing apparatus 2 for carrying out a developing method according to the present invention will be described with reference to FIG. 1. The developing apparatus 2 includes three developing units 21a, 21b and 21c, composite nozzle units 4a, 4b and 4c, and a main developer nozzle 6. The developing units are provided with spin chucks 22a, 22b and 22c, namely, substrate holding devices, respectively. Each of the spin chucks 22a, 22b and 22c holds a wafer W in a horizontal position by attracting a central part of the lower surface of the wafer W by suction.

The developing units 21a to 21c are similar in construction and hence the developing unit 21a will be described by way of example. The spin chuck 22a is connected to a drive mechanism 24, namely, a rotational drive mechanism, by a rotational shaft 24. The spin chuck 22a holding a wafer W can be rotated about a vertical axis and can be vertically moved by the drive mechanism 24. The wafer W is held on the spin chuck 22a coaxially with the spin chuck 22a. The drive mechanism 24 is controlled by control signals provided by a controller 100, which will be described later, to control the rotating speed of the spin chuck 22a.

The spin chuck 22a and the wafer W held on the spin chuck 22a are surrounded by a cup 25 having an open upper end. An upper end part of a side wall of the cup 25 is tapered upward in a conical part 26. As shown in FIG. 1, a sump 31 having, for example, the shape of a groove is formed in a lower part of the cup 25. The sump 31 is divided by a partition wall, not shown, into an outer area and an inner area extending below the circumference of the wafer W. a drain port, not shown, is formed in the bottom of the outer area to drain a developer and such collected in the outer area. Discharge ports 32 and 33 are formed in the bottom of the inner area to discharge a processing atmosphere. An exhaust pipe 34 has one end connected to the discharge ports 32 and 33. The other ends of the exhaust pipes 34 of the developing units 21a. 21b and 21c are connected respectively through exhaust dampers 35 to the exhaust line of, for example, a plant in which the developing apparatus 2 is installed. Each of the exhaust dampers 35 is controlled by control signals provided by the controller 100 to control the rate of discharging the processing atmosphere from the cup 25.

Figure 2:
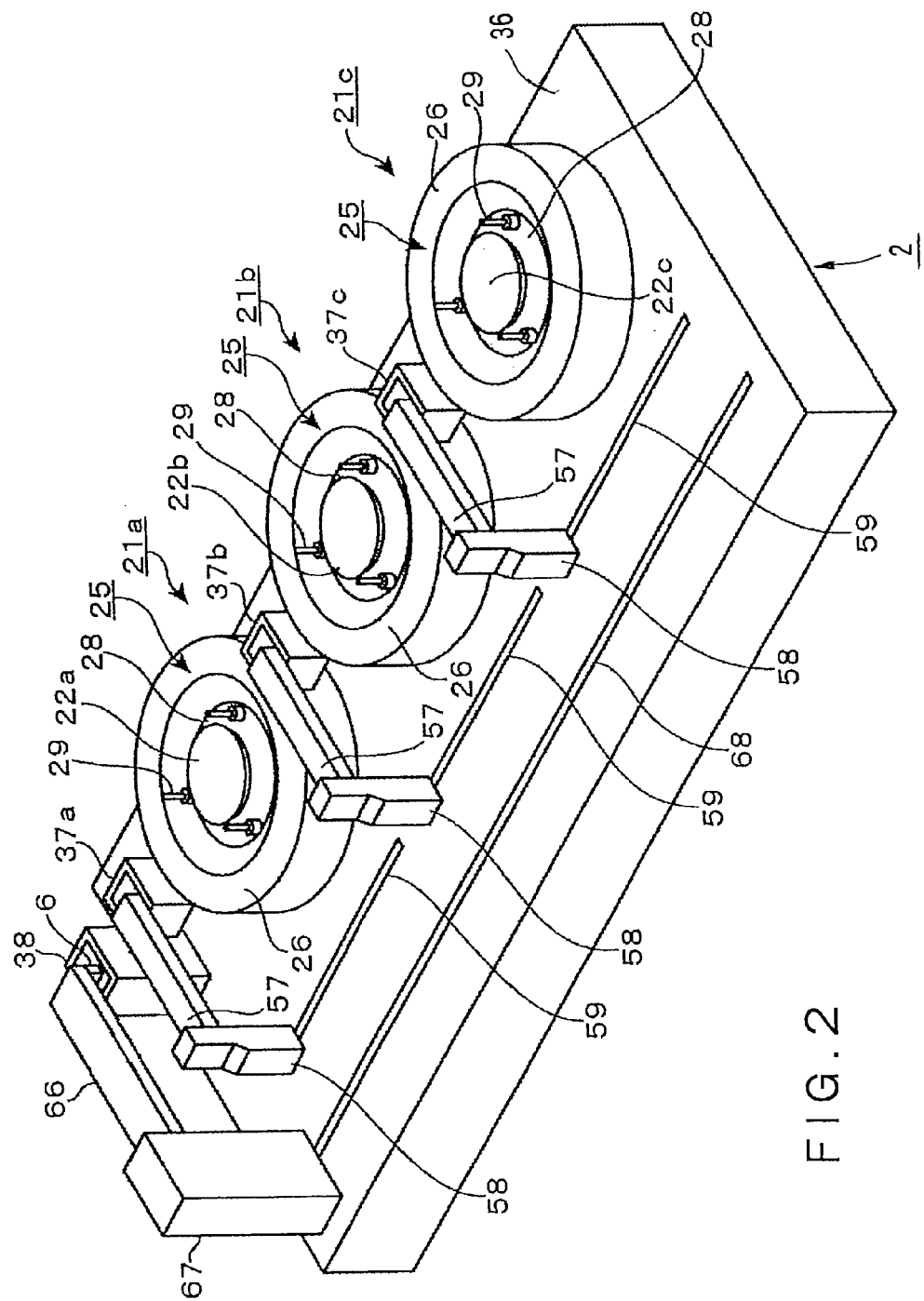
FIG. 2 is a perspective view of the developing apparatus shown in FIG. 1.
Figure 3:
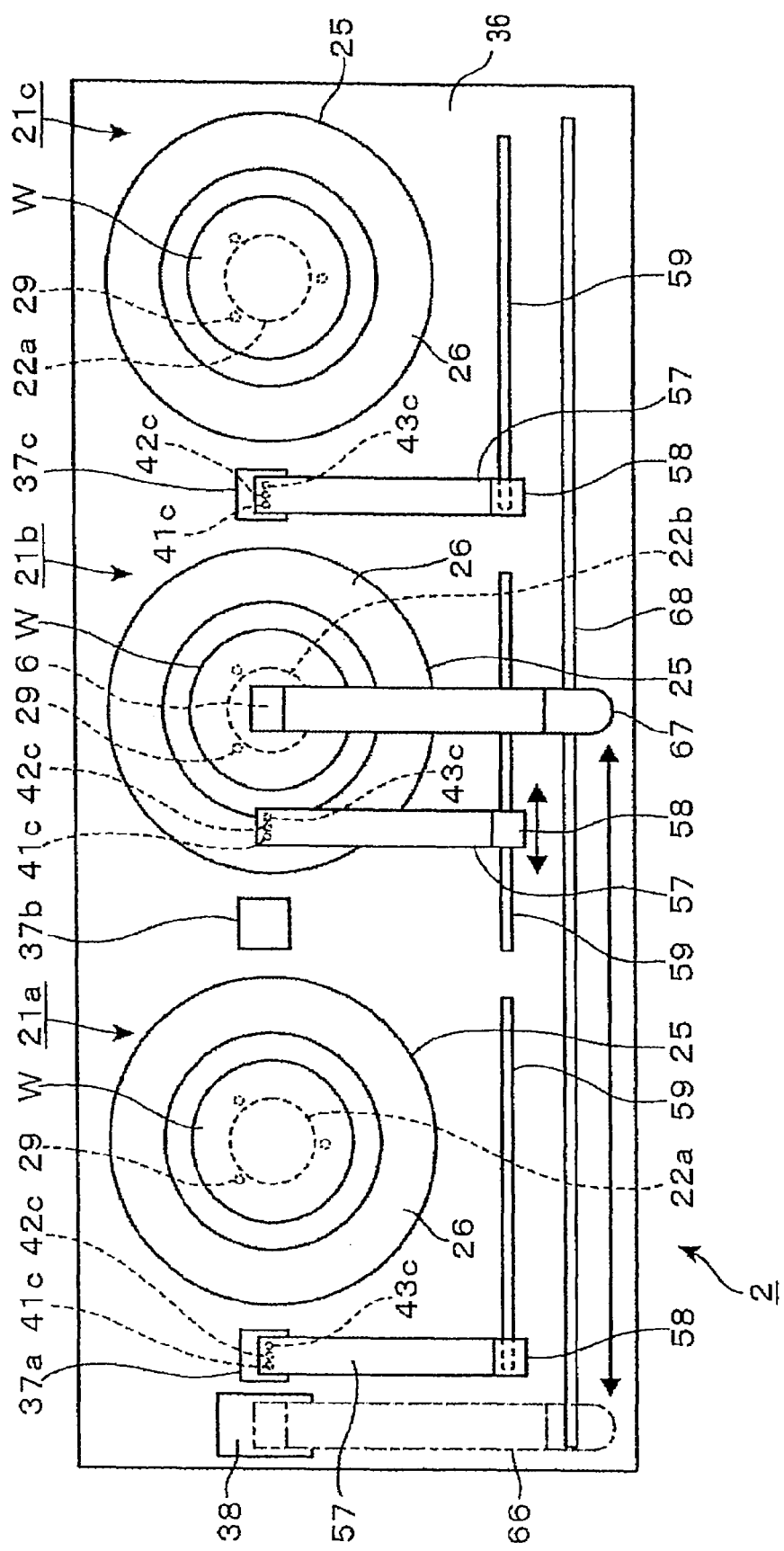
FIG. 3 is a plan view of the developing apparatus shown in FIG. 1.

FIGS. 2 and 3 are a schematic perspective view and a schematic top view, respectively, of the developing apparatus 2 shown in FIG. 1. In FIGS. 2 and 3, indicated at 28 are disks horizontally set in the cups 25, respectively. Three lifting pins 29 extend vertically through each disk 28 so as to be vertically movable. A drive unit, not shown, moves the lifting pins 29 vertically according to operations of a substrate carrying mechanism, not shown, to transfer a wafer W delivered to the processing unit 21a from the substrate carrying mechanism to the spin chuck 22a by the cooperative operations of the substrate carrying mechanism and the lifting pins 29. The drive unit for vertically moving the lifting pins 29 gives a signal representing the state of vertical movement of the lifting pins 29 to the controller 100. Upon the reception of this signal, the controller 100 decides whether or not wafers W have been carried into the cups 25 of the developing units 21a to 21c. The controller 100 moves the nozzles according to the decision to the developing units 21a to 21c to which wafers W have been delivered for processing.

The composite nozzle units 4a, 4b and 4c will be described. The composite nozzle units 4a, 4b and 4c are used for pouring a developer and pure water onto and blowing $N_2$ (nitrogen gas) on wafers W placed in the developing units 21a, 21b and 21c. The composite nozzle units 4a to 4c are similar in construction and hence the composite nozzle unit 4a will be described by way of example with reference to FIG. 4.

The composite nozzle unit 4a is provided with a secondary developer nozzle 41a, a pure water nozzle 42a, and a $N_2$ nozzle 43a. The nozzles 41a, 42a and 43a are arranged along a diameter of a wafer W. The nozzles 41a, 42a and 43a are provided with circular outlet openings 44a, 45a and 46a opening vertically downward, respectively. The diameter L1 of the outlet opening 44a of the secondary developer nozzle 41a is, for example, in the range of 0.1 to 10 mm.

As shown in FIG. 1, the developer nozzle 41a is connected to a developer source 5A holding a developer by a supply line 51, the pure water nozzle 42a is connected to a pure water source 5B holding pure water by a supply line 52, and the $N_2$ nozzle 43a is connected to a $N_2$ source 5C holding $N_2$, namely, an inert gas, by a supply line 53. Pure water is used as a surface-treatment liquid for a prewetting process for improving the wettability of a wafer W to be executed prior to pouring the developer onto the wafer W, and a rinsing liquid for rinsing the unnecessary developer away after development. Flow control devices 54, 55 and 56 are placed in the supply lines 51, 52 and 53, respectively. Each of the flow control devices 54 to 56 includes a valve and a mass flow controller. The flow control devices 54 to 56 start and stop pouring the processing liquids onto the wafer W and start and stop blowing the gas on the wafer W through the nozzles 41a, 41b and 41c according to control signals received from the controller 100.

Figure 4:
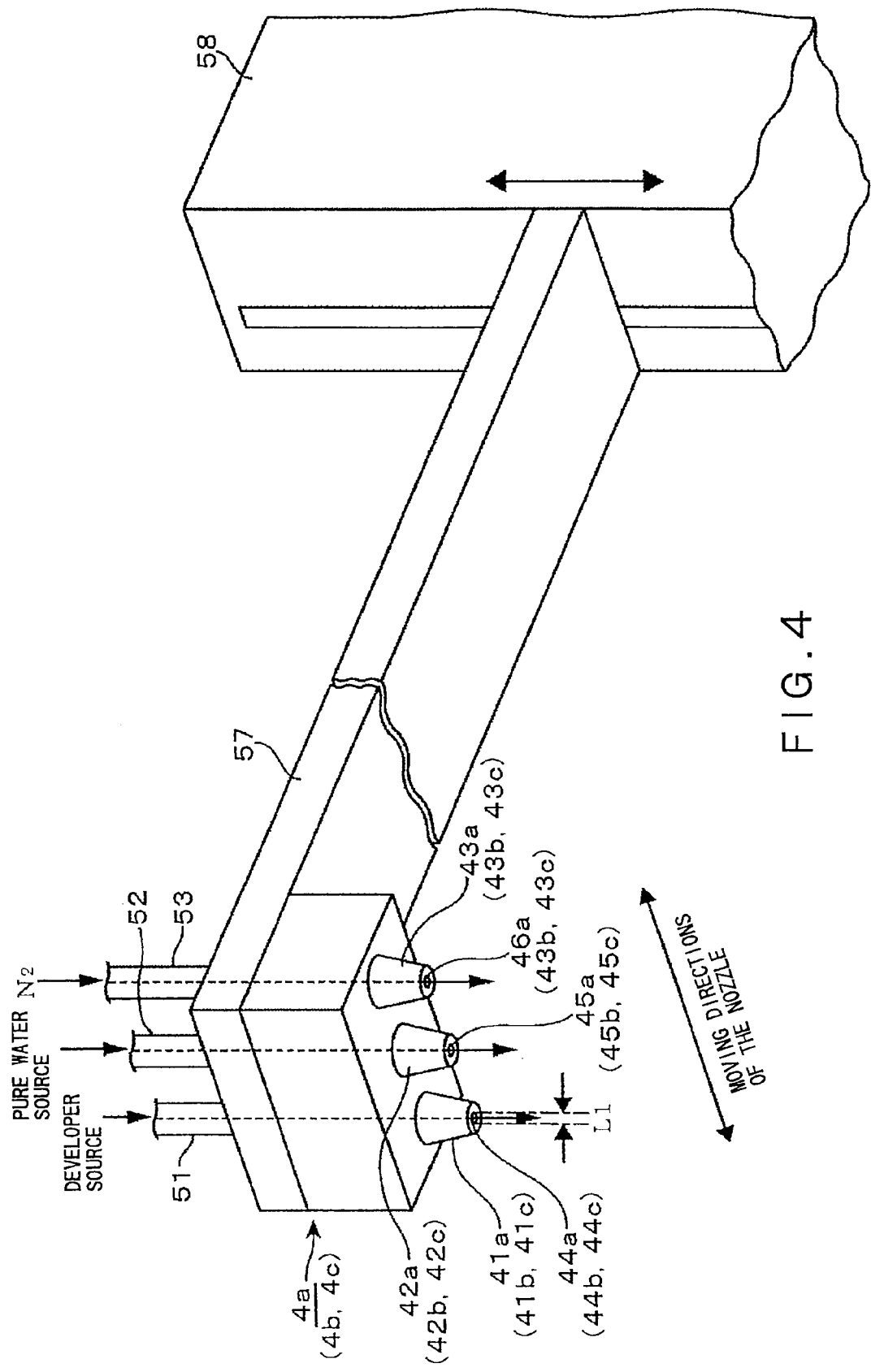
FIG. 4 is a perspective view of a composite nozzle unit included in the developing apparatus shown in FIG. 1.
Figure 6A:
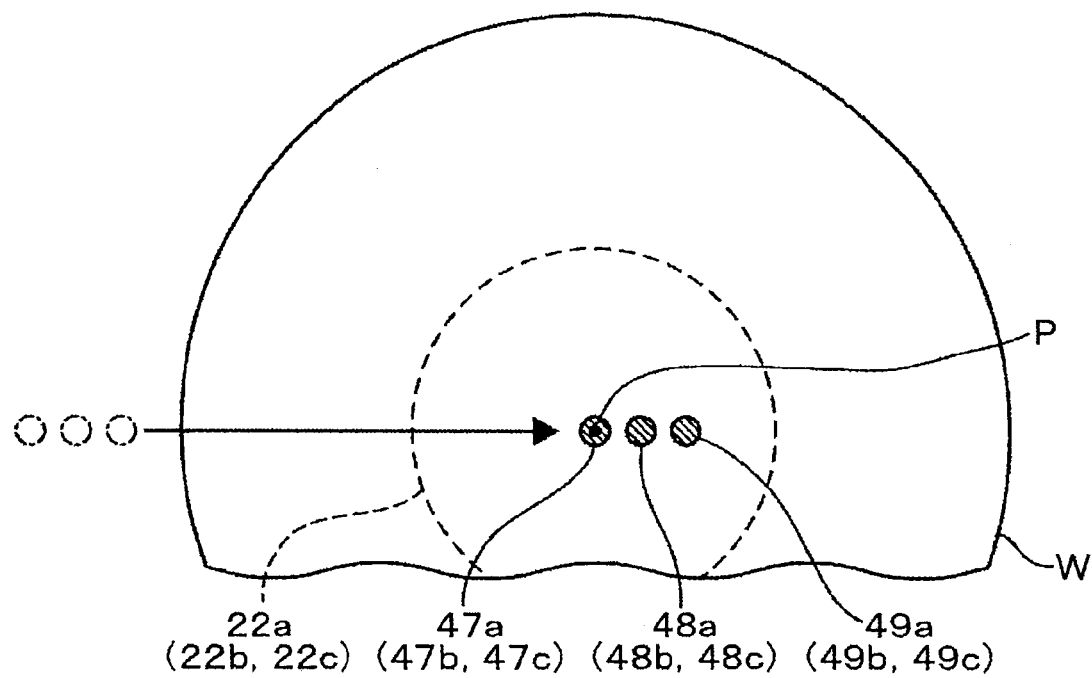
FIGS. 6A and 6B are diagrammatic views of assistance in explaining the movement of projection areas corresponding to the respective projections of the main developer nozzle, and each of the nozzles of the composite nozzle unit.

As shown in FIG. 4, the composite nozzle unit 4a is attached to one end of an arm 57. The other end of the arm 57 is connected to a drive mechanism 58 disposed on a bed 36 extended in a direction in which the developing units 21a to 21c are arranged. The drive mechanism 58 moves transversely along a guide 59 extended in a direction in which the developing units 21a, 21b and 21c are arranged. In FIG. 6A, indicated at 47a, 48a and 49a are projective areas corresponding to the projections of the outlet openings 44a, 45a and 46a of the nozzles 41a, 42a and 43a projected on a wafer W held on the spin chuck 22a. The projective areas 47a, 48a and 49a can be moved from a position above a peripheral part of the wafer W to a position above the center P of the wafer W by moving the composite nozzle unit 4a by the drive mechanism 58. The drive mechanism 58 moves the arm 57 vertically to move the composite nozzle unit 4a vertically. The vertical movement of the arm 57 by the drive mechanism 58 and the transverse movement of the drive mechanism 58 are controlled by control signals provided by the controller 100. The outlet openings 44a, 45a and 46a are located at a height in the range of, for example, 5 to 20 mm from the surface of the wafer W when the developer and pure water is poured onto the wafer W and when N₂ is blown on the wafer W through the outlet openings 44*a*, 45*a* and 46*a*.

The composite nozzle unit 4*b* has nozzles 41*b*, 42*b* and 43*b* provided with outlet openings 44*b*, 45*b* and 46*b*, respectively. The composite nozzle unit 4*c* has nozzles 41*c*, 42*c* and 43*c* provided with outlet openings 44*c*, 45*c* and 46*c*, respectively. Projective areas 47*b*, 48*b* and 49*b* of the outlet openings 41*b* 42*b* and 43*b*, and projective areas 47*c*, 48*c* and 49*c* of the outlet openings 41*c*, 42*c* and 43*c*, similarly to those of the composite nozzle unit 4*a*, can move from a peripheral part to a central part of the corresponding wafers W, respectively.

The main developer nozzle 6 will be described with reference also to FIG. 5. The main developer nozzle 6 is provided with an outlet opening 62 having the shape of a slit in its lower end surface, opening vertically downward and extending in a direction in which the main developer nozzle 6 is moved. The length L2 of the outlet opening 62 is parallel to a diameter of the wafer W. The developer is poured in a band-shaped flow onto the wafer W. The outlet opening 62 has a length L2 in the range of, for example, 5 to 15 mm and a width L3 in the range of, for example, 0.1 to 1 mm.

As shown in FIG. 1, a developer supply pipe 64 has one end connected to the main developer nozzle 6 and the other end connected through a flow control device 65 including a valve and a mass flow controller to the developer source 5A. The flow control device 65 starts and stops supplying the developer to the main developer nozzle 6 according to control signals provided by the controller 100.

Figure 5:
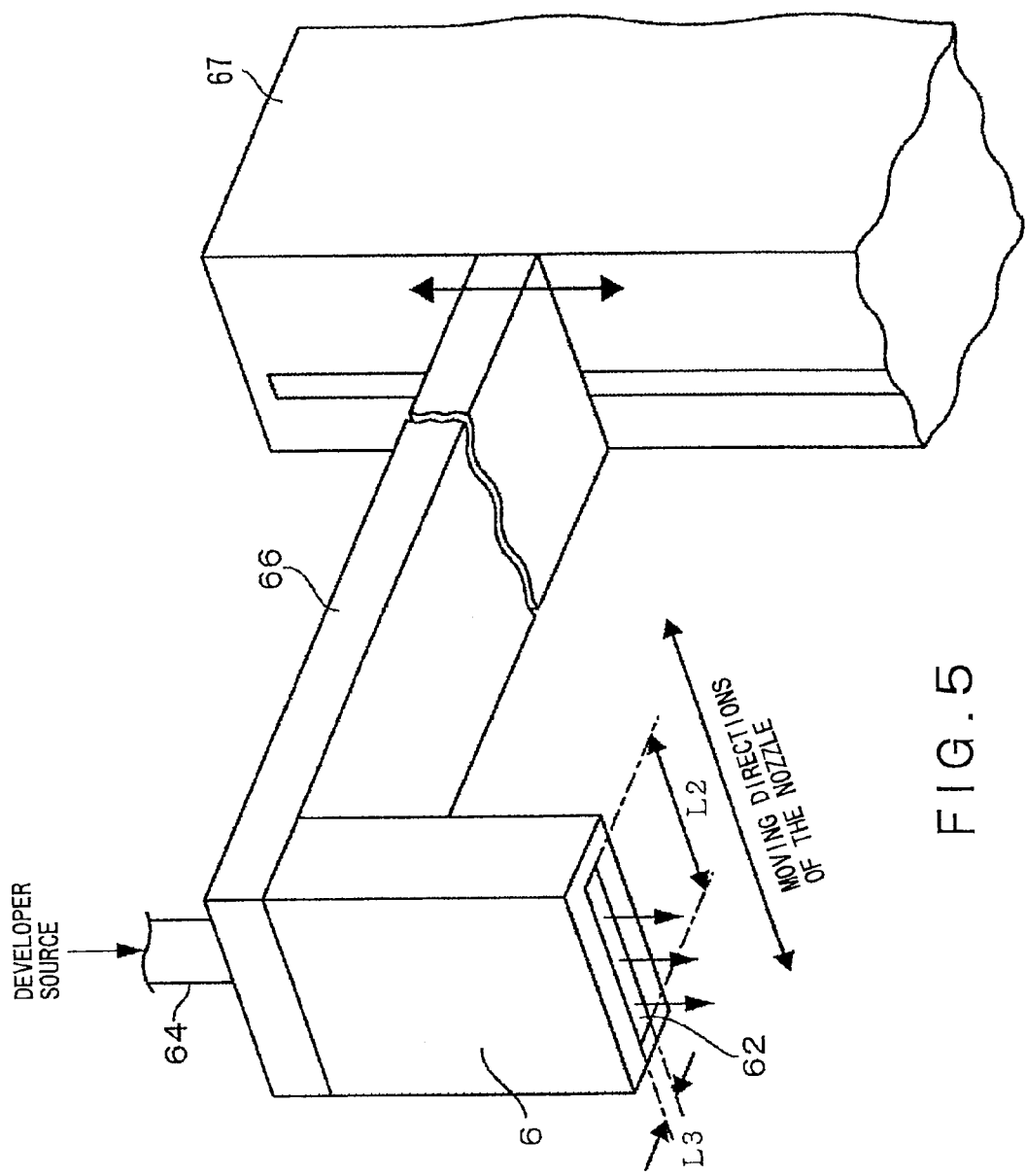
FIG. 5 is a perspective view of a main developer nozzle included in the developing apparatus shown in FIG. 1.
Figure 6B:
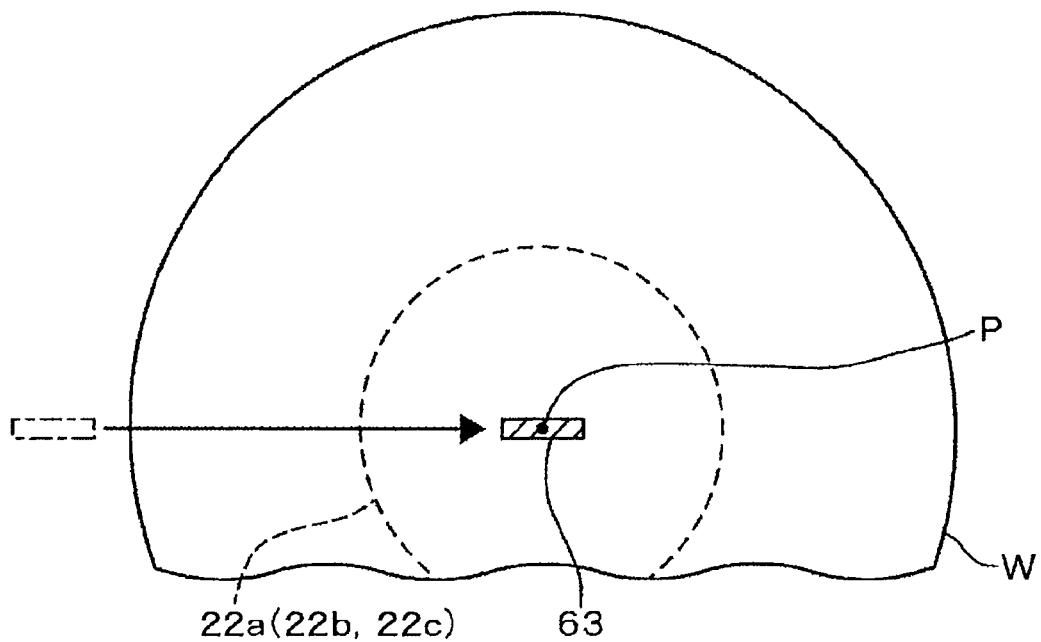

As shown in FIG. 5, an arm 66 has one end to which the developer nozzle 6 is attached and the other end connected to a drive mechanism 67 disposed on the bed 36. The drive mechanism 67 moves transversely along a guide 68 extended on the bed 36 in the direction in which the developing units 21*a*, 21*b* and 21*c* are arranged. The drive mechanism 67 can vertically move the arm 66 holding the main developer nozzle 6. The main developer nozzle 6 can be located at a position above each of the wafers W held on the spin chucks 22*a*, 22*b* and 22*c* by transversely moving the drive mechanism 67 and vertically moving the arm 66 without interfering with the composite nozzle units 4*a*, 4*b* and 4*c* and the arms 57 to which the composite nozzle units 4*a*, 4*b* and 4*c* are attached, respectively. As shown in FIG. 6B, a projection area 63 corresponding to the projection of the outlet opening 62 of the main developer nozzle 6 can be moved along a diameter of each of the wafers W respectively held on the spin chucks 22*a*, 22*b* and 22*c* with one end thereof directed toward the center P of the wafer W from a peripheral part to the center P of the wafer W. The transverse movement of the drive mechanism 67 and the vertical movement of the arm 66 are controlled by control signals provided by the controller 100. The outlet opening 62 is at a height, for example, between 15 and 20 mm from the surface of the wafer W when the developer is poured onto the wafer W.

The developing apparatus 2 is provided with three composite nozzle unit holders 37*a*, 37*b* and 37*c* of the shape of a cup having an open upper end respectively for holding the composite nozzle units 4*a*, 4*b* and 4*c* waiting. The composite nozzle units 4*a*, 4*b* and 4*c* are received in the composite nozzle unit holders 37*a*, 37*b* and 37*c*, respectively, and are held in a waiting state while the same are not used for processing the wafers W. The developing apparatus 2 is provided with a main developer nozzle holder 38 of the shape of a cup having an open upper end for the main developer nozzle 6. The main developer nozzle 6 can be held at its home position in the main developer nozzle holder 38 and can be held in a waiting state. As will be described in connection with the description of operations of the developing apparatus 2, the main developer nozzle 6 is not returned to the home position in the main developer nozzle holder 38 and is held in a waiting state in the vicinity of the cup 25 of the developing unit 21*a*, 21*b* or 21*c* until processing a predetermined number of wafers W, such as one lot of wafers W, is completed.

The composite nozzle unit holders 37*a*, 37*b* and 37*c* and the developing unit 21*a*, 21*b* and 21*c* are arranged alternately in a line. The main nozzle holder 38 is disposed beside the developing unit 21*a*.

The controller 100 will be described. The controller 100 is, for example, a computer and has a program storage device, not shown. A program, namely, a piece of software including a set of instructions for the controller 100 to execute to carry out a developing process, which will be described later. The controller 100 reads the program from the program storage device and controls the rotating speed of the wafer, movement of the nozzles, and pouring the developer and pure water on the wafer, blowing N₂ on the wafer and such. For example, a storage medium, such as a hard disk, a compact disk, a magnetooptical disk or a memory card, storing the program is stored in the program storage device.

A series of steps of a developing process to be carried out by the developing apparatus 2 to process a wafer W will be described with reference to FIGS. 7 to 9. For example, a substrate carrying mechanism, not shown, carries wafers W repeatedly to the developing units 21*a*, 21*b* and 21*c* in that order. Each of the wafers W having a surface coated with a resist has been processed by an exposure process. Suppose, for convenience sake, that wafers W1, W2 and W3 are carried to the developing unit 21*a*, 21*b* and 21*c*, respectively.

Figure 7A:
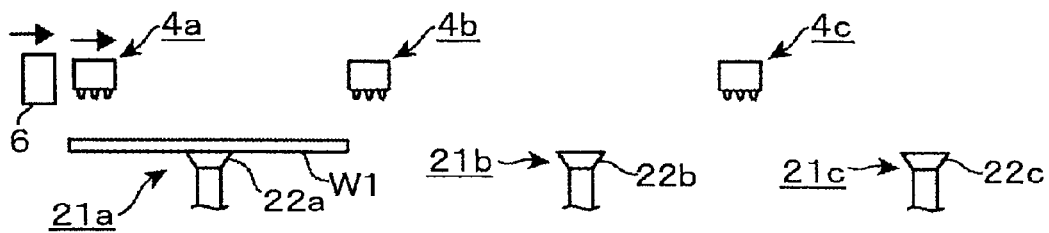
FIGS. 7A to 7E are views of assistance in explaining developing steps to be executed by the developing apparatus shown in FIG. 1.

The cups 25 are evacuated by a predetermined amount of atmospheres therein, and the substrate carrying mechanism carries the wafer W1 to the developing unit 21*a*. Then, the wafer W1 is placed on the spin chuck 22*a* by the cooperative operations of the lifting pins 29 of the developing unit 21*a* and the substrate carrying mechanism in the cup 25. Then, the controller 100 provides control signals to move the main nozzle 6 and the composite nozzle unit 4*a* respectively from the main developer nozzle holder 38 and the composite nozzle unit holder 37*a* to positions above the wafer W1 as shown in FIG. 7A.

Figure 7B:
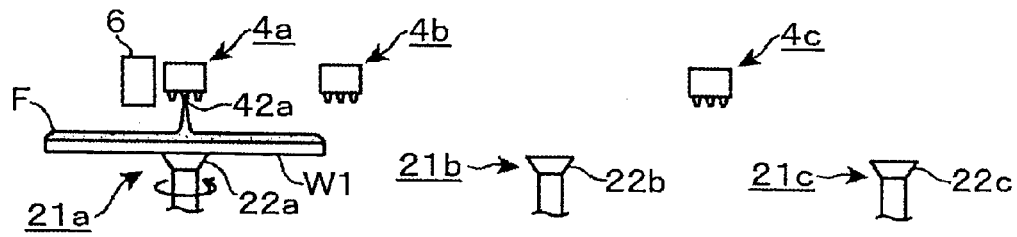

Then, the spin chuck 22*a* holding the wafer W1 rotates, for example, at 1500 rpm, the composite nozzle unit 4*a* is moved such that the outlet openings 44*a*, 45*a* and 46*a* of the nozzles 41*a*, 42*a* and 43*a* of the composite nozzle unit 4*a* are at a height in the range of 15 to 20 mm and the pure water nozzle 42*a* is at a position above the center of the wafer W1. Subsequently, pure water F is poured through the pure water nozzle 42*a*. The poured pure water F is spread from a central part toward the circumference of the wafer W1 by centrifugal force in a so-called spin coating mode to cover the wafer W1 as shown in FIG. 7B.

Figure 7C:
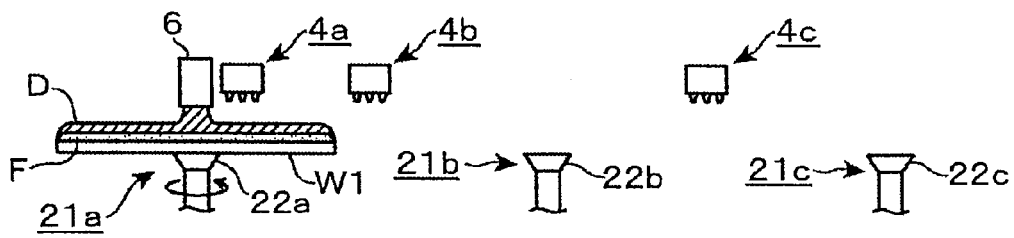

Pouring the pure water F is stopped after pouring the pure water F for a predetermined time, the composite nozzle unit 4*a* is moved toward the circumference of the wafer W1, and the main developer nozzle 6 is moved to a position above the center of the wafer W1 such that the outlet opening 62 of the main developer nozzle 6 is at a height in the range of 15 to 20 mm from the surface of the wafer W1. Then, a developer D is poured through the main developer nozzle 6 at a pouring rate in the range of 100 to 1000 ml/min, for example, at 600 ml/min onto a central part of the wafer W1. The developer D is spread over the film of the pure water F in a spin coating mode toward the circumference of the wafer W1. The developer D coats parts not coated with the pure water F of the surface of the wafer W1 and forms a film of the developer entirely coating the surface of the wafer W1 as shown in FIG. 7C.

Figure 7D:
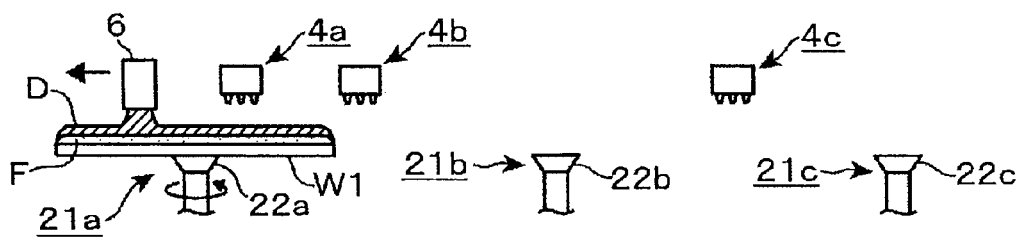
Figure 7E:
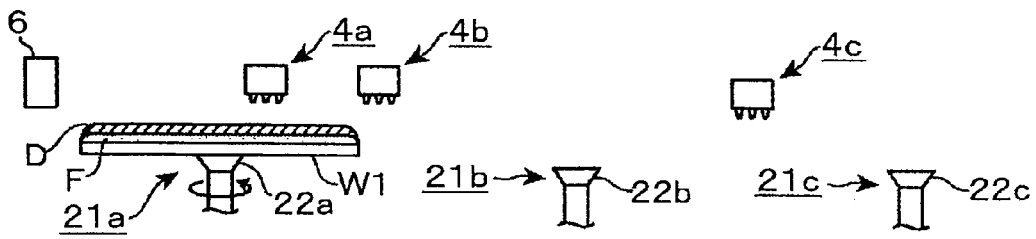

After the developer D has been poured through the main developer nozzle 6 for a predetermined time, the rotating speed of the wafer W1 is reduced to 700 rpm and the main developer nozzle 6 pouring the developer D is moved toward the circumference of the wafer W1 as shown in FIG. 7D. For example, upon the arrival of a position onto which the developer is poured at a position on the surface of the wafer W1 at a distance equal to about ⅓ of the radius of the wafer W1 from the center of the wafer W1, pouring the developer D through the main developer nozzle 6 is stopped. The main developer nozzle 6 continues moving toward the circumference of the wafer W1 after pouring the developer D has been stopped. The main developer nozzle 6 is stopped at a position slightly outside a position above the circumference of the wafer W1 as shown in FIG. 7E.

Figure 8A:
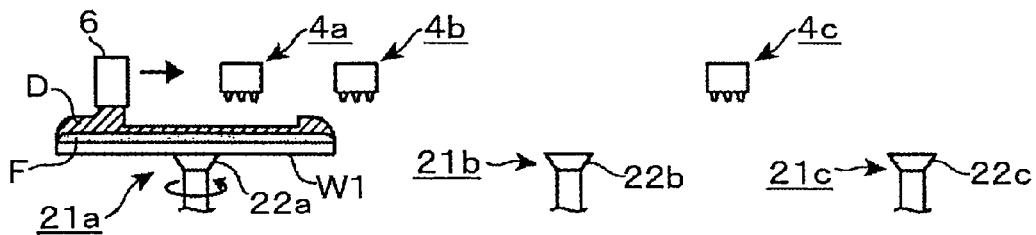
FIGS. 8A to 8E are views of assistance in explaining developing steps to be executed by the developing apparatus shown in FIG. 1.

Subsequently, the rotating speed of the wafer W1 is raised to, for example, 1200 rpm, the main developer nozzle 6 is moved from the position outside the wafer W1 toward the center of the wafer W1 while the developer D is being poured through the main developer nozzle 6 at a pouring rate in the range of 100 to 1000 ml/min, for example, at 600 ml/min. Thus a position onto which the developer D is poured on the surface of the wafer W1 moves from peripheral part toward the central part of the wafer W1 along a spiral. The developer D poured onto the wafer W1 is spread radially outward over the film of the developer D previously formed on the surface of the wafer W1 by centrifugal force generated by rotating the wafer W1. Consequently, a film of the developer D having a recessed central part is formed as shown in FIG. 8A. The diameter of the recessed central part decreases gradually as the main developer nozzle 6 approaches the center of the wafer W1.

Figure 8B:
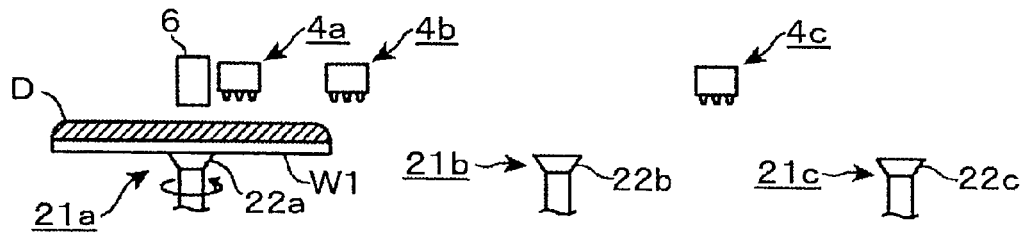
Figure 8C:
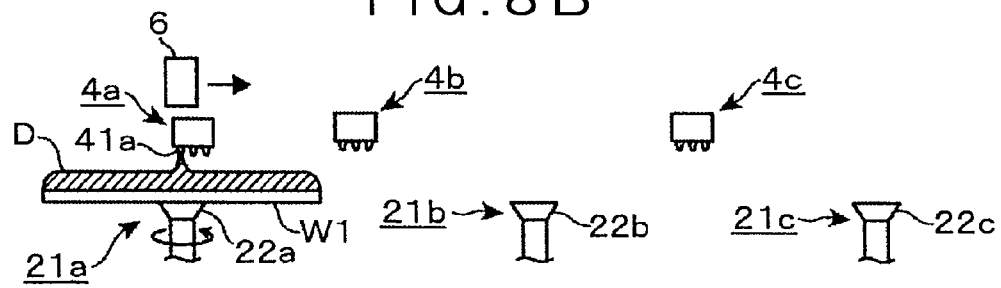
Figure 8D:
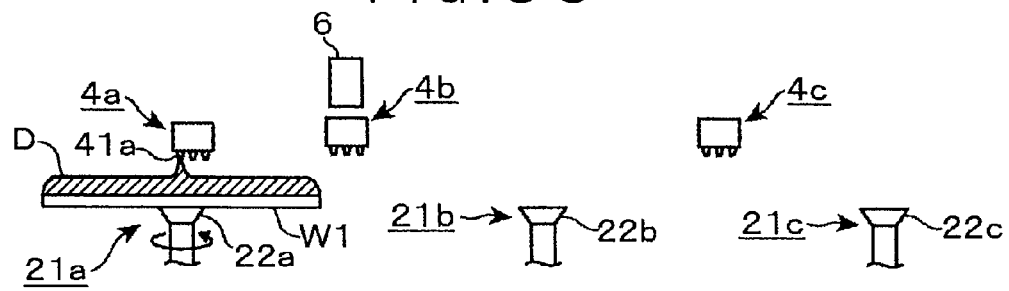

The main developer nozzle 6 continues moving. When the center of the wafer W1 is contained in the projection area 63 corresponding to the projection of the outlet opening 62 of the main developer nozzle 6 and the developer D is poured onto the center of the wafer W1, the recessed central part disappears. Then, pouring the developer D through the main developer nozzle 6 is stopped as shown in FIG. 8B. Subsequently, the main developer nozzle 6 is moved to the developing unit 21b and is held waiting, for example, in the vicinity of the cup 25 of the developing unit 21b, and the composite nozzle unit 4a is moved to a position above a central part of the wafer W1 such that the secondary developer nozzle 41a is located at a position above the central part of the wafer W1. Then, the developer D is poured through the secondary developer nozzle 41a onto the central part of the wafer W1 at a pouring rate in the range of 100 to 1000 ml/min, for example at 250 ml/min, within a time of, for example 2 sec, in which the film of the developer D can dry, from the time pouring the developer through the main developer nozzle 6 was stopped as shown in FIGS. 8C and 8D. The developer D poured through the secondary developer nozzle 41a onto the central part of the wafer W1 is spread over the film of the developer D toward the circumference of the wafer W1 to prevent the film of the developer D from drying.

For example, after a predetermined time in the range of, for example, 10 to 20 s since the secondary developer nozzle 41 started pouring the developer D, pouring the developer D is stopped, the pure water nozzle 42a is located at a position above the center of the wafer W1, and then the pure water F is poured through the pure water nozzle 42a onto the central part of the wafer W1. The pure water F poured onto the wafer W1 is spread outward along the surface by centrifugal force generated by the rotation of the wafer W1 and exerted thereon to rinse the developer D containing the dissolved resist away to clean the surface of the wafer W1.

Figure 8E:
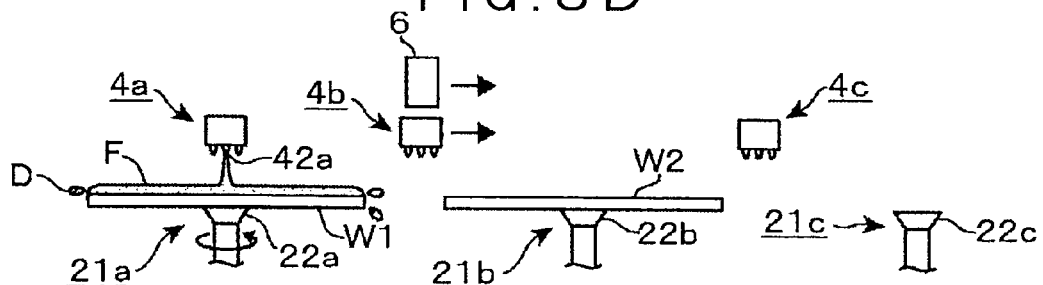

For example, if the substrate carrying mechanism, not shown, carries the wafer W2 to a position above the spin chuck 22b and the wafer W2 is received in the cup 25 by vertically moving the lifting pins 29, the main developer nozzle 6 held waiting outside the cup 25 is moved to a position above the wafer W2, and then a developing process including the same steps as those of the developing process used for processing the wafer W1 in the developing unit 21a is started as shown in FIG. 8E. When the main developer nozzle 6 is moved into the developing unit 21b after the wafer W has been carried into the cup 25 of the developing unit 21b, the main developer nozzle 6 is moved to a position above the wafer W2 without holding the main developer nozzle 6 waiting and, at the same time, the composite nozzle unit 4b is moved from the composite nozzle unit holder 42b to a position above the wafer W2 to start the developing process.

Figure 9A:
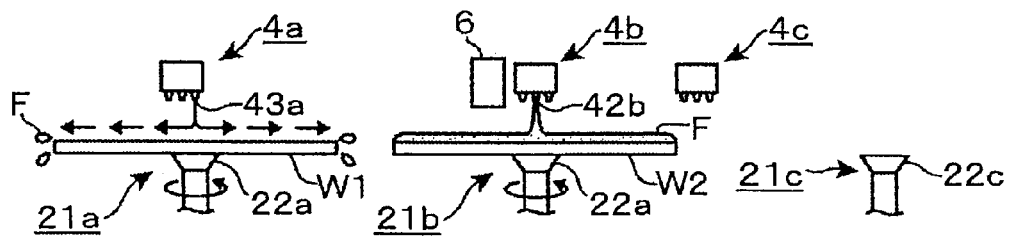
FIGS. 9A to 9E are views of assistance in explaining developing steps to be executed by the developing apparatus shown in FIG. 1.

Meanwhile, pouring the pure water F in the developing unit 21a is stopped after pouring the pure water F for a predetermined time, the rotating speed of the wafer W1 is raised to, for example, 2000 rpm, the $N_2$ nozzle 43a is located at a position above the central part of the wafer W1, and $N_2$ is blown on the central part of the wafer W1. The cup 25 is evacuated simultaneously with blowing $N_2$ on the wafer W1 to create gas currents flowing from the center of the wafer W1 toward the circumference of the wafer W1. Liquids adhering to the wafer W1 are removed from the wafer W1 by the agency of the gas currents and centrifugal force to dry the wafer W1 as shown in FIG. 9A.

Figure 9B:
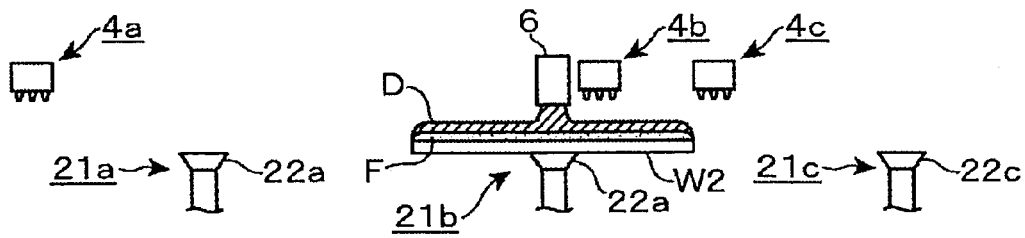
Figure 9C:
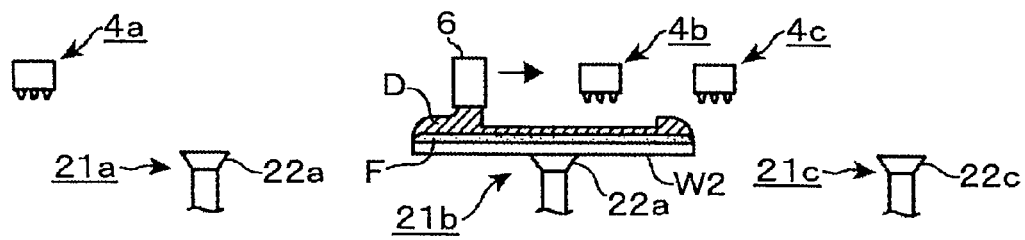
Figure 9D:
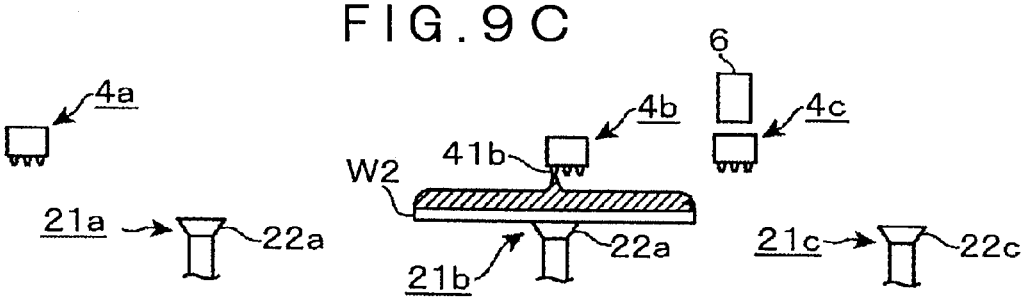

After the wafer W1 has been dried, blowing $N_2$ through the $N_2$ nozzle 43a is stopped, the composite nozzle unit 43a is moved to and held waiting in the composite nozzle holder 37a. The rotating spin chuck 21a is stopped, the wafer W1 is carried outside the cup 25 by the cooperative operations of the carrying mechanism, not shown, and the lifting pins 29 as shown in FIG. 9B. The second developing unit 21b, similarly to the first developing unit 21a, continues processing the wafer W2 by a developing process including the sequential steps of pouring pure water through the pure water nozzle 42b, pouring the developer through the main developer nozzle 6 onto the center of the wafer W2, moving the main developer nozzle 6 toward a position corresponding to the circumference of the wafer W2 while developer is being poured through the main developer nozzle 6, and moving the main developer nozzle 6 from the position corresponding to the circumference of the wafer W2 toward a position corresponding to the center of the wafer W2 while the developer is being poured through the main developer nozzle 6. Upon the completion of those steps, the main developer nozzle 6 is moved to the developing unit 21c and is held waiting, for example, at a position in the vicinity of the cup 25 of the developing unit 21c as shown in FIGS. 9C and 9D.

Figure 9E:
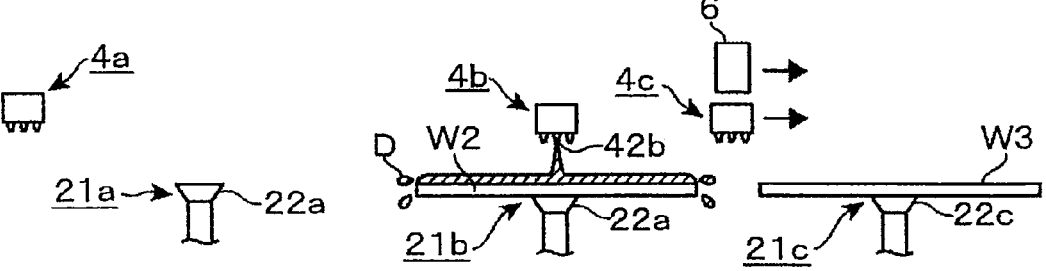

The wafer W2 is processed continuously by the second developing unit 21b; pure water is poured onto the wafer W2 to rinse the developer away, and the wafer W2 is dried by a drying process. After the drying process has been completed, the composite nozzle unit 4b is returned to the composite nozzle unit receiving member 37b. When the wafer W3 is carried to the third developing unit 21c, the main developer nozzle 6 is moved from its home position on the main developer nozzle holder to a position above the wafer W3 and the composite nozzle unit 4c is moved from the home position on the composite nozzle unit holder 37c to a position above the wafer W3. Then, the wafer W3, similarly to the wafer W1 processed by the first developing unit 21a, is subjected to a series of steps of the developing process as shown in FIG. 9E.

Subsequently, wafers W are carried successively to the developing units 21a, 21b and 21c in that order, and the main developer nozzle 6 is moved to the developing units 21a, 21b and 21c sequentially in that order. The composite nozzle unit 4 of the developing unit 21 to which the main developer nozzle 6 is moved is moved from the composite nozzle unit holder 37 to a position above the wafer W to process the wafer W by the developing process. After the main developer nozzle 6 has poured the developer onto a predetermined number of wafers W, the main developer nozzle 6 is returned to the main developer nozzle holder 38, and then the series of processes are carried out by the composite nozzle unit 4 for processing the last wafer W. After the completion of the series of processes, the composite nozzle unit 4 is returned to the corresponding composite nozzle unit holder 37, the last wafer W is carried out from the developing apparatus 2 to end the processing operations of the developing apparatus 2.

In the developing apparatus 2, the main developer nozzle 6 common to the developing units 21a, 21b and 21c pours the developer in a band-shaped flow onto the wafers W delivered to the developing units 21a, 21b and 21c. After developer films have been formed on the wafers W delivered to the developing units 21a, 21b and 21c, respectively, the secondary developer nozzles 41a, 41b and 41c pours the developer onto the wafers W in a circular area narrower than a band-shaped area in which the developer is poured by the main developer unit 6 at a pouring rate lower than that at which the developer is poured to form the developer films to prevent the developer film from drying. Thus the developer nozzles are selectively used according to developer pouring rate at which the developer is poured onto the wafer W. The developer is poured through the main developer nozzle 6 at a low pouring rate to stabilize pouring the developer as compared with pouring the developer to prevent the developer film from drying so that the occurrence of development defects may be suppressed. The quantity of the developer to be poured onto the wafers W can be reduced by pouring the developer through the secondary developer nozzles 41a, 41b and 41c at a pouring rate lower than that at which the developer is poured through the main developer nozzle 6 to suppress the increase of the cost of the developing process.

The developing units 21a, 21b and 21c of the developing apparatus 2 use the main developer nozzle 6 in common. Therefore, the developing apparatus 2, as compared with a case in which the developing units 21a, 21b and 21c are provided with main developer nozzles 6, can be manufactured at a low manufacturing cost. Common use of the main developer nozzle by the developing units 21a, 21b and 21c simplifies the developer supply line and reduces manufacturing labor and cost. The common use of the developer supply line, as compared with providing the developing units 21a, 21b and 21c with individual developer supply lines, can suppress difference in developer pouring mode among the developing units 21a, 21b and 21c.

The foregoing embodiment forms the pure water film on the wafer W and then pours the developer onto the central part of the wafer W to form a developer film over the pure water film to improve wettability. Therefore, the developer poured through the main developer nozzle 6 being moved from the position corresponding to the peripheral part toward the position corresponding to central part of the wafer W can spread uniformly over the wafer W. Consequently, the occurrence of development defects and irregularities in the CD of the lines and such of the resist pattern can be suppressed. The main developer nozzle 6 does not necessarily need to be moved from the position corresponding to the circumference toward the position corresponding to the central part of the wafer W pouring the developer onto the wafer W, the main developer nozzle 6 may be moved from the position corresponding to the central part of the wafer W toward the position corresponding to the circumference of the wafer W.

The foregoing embodiment pours pure water on the wafer W, pours the developer through the main developer nozzle 6 on the central part of the wafer W, and then moves the main developer nozzle toward the position corresponding to the circumference of the wafer W pouring the developer onto the wafer W. Thus the peripheral part of the wafer W apart from the central part of the wafer W can be surely wetted with the developer so that the peripheral part may be satisfactorily wetted with the developer when the main developer nozzle 6 is moved from the position corresponding to the circumference of the wafer W toward the position corresponding to the central part of the wafer W pouring the developer onto the wafer W. Thus the occurrence of development defects and the irregularities in the CD can be suppressed. That is, the developer is poured not for development but for prewetting to improve the wettability of the surface of the wafer W. Pouring pure water and the developer onto the wafer W before moving the main developer nozzle 6 from the position corresponding to the circumference of the wafer W toward the position corresponding to the central part of the wafer W is effective particularly in wetting a highly water-repellent resist film difficult to wet with the developer, which is subjected to an immersion exposure process. An immersion exposure process to be carried out by an exposure system achieves exposure in a high resolution by filling up a gap between a lens used for exposure and a wafer with a liquid to refract a light beam projected through the lens on the wafer. Since the purpose of pouring the developer onto the central part of the wafer W after pouring pure water onto the wafer W and the subsequent movement of the main developer nozzle 6 from a position corresponding to the central part of the wafer W toward the position corresponding to the circumference of the wafer is only wetting the surface of the wafer W with the developer, the secondary developer nozzles 41a, 41b and 41c may be used for this purpose.

The foregoing embodiment pours pure water for prewetting before pouring the developer onto the wafer W. This prewetting for improving wettability of the wafer to be wetted with the developer is preferable because even a small quantity of the developer can be more surely spread over the surface of the wafer W.

Since the main developer nozzle 6 only needs to pour the developer on to the wafer W in a band-shaped flow, the flat outlet opening 62 may have the shape of, for example, a flat circle or a flat rectangle. The main developer nozzle 6 may be provided with an outlet opening formed by arranging plural circular opening in the moving direction of the main developer nozzle 6, an elliptic opening formed with its major axis extended in the moving direction of the main developer nozzle 6 or a rhombic opening formed with its diagonal extended in the moving direction of the main developer nozzle 6. The respective outlet openings 45a, 45b and 45c of the secondary developer nozzles 42a, 42b and 42c having a shape other than a substantially circular shape are within the scope of the present invention provided that the developer can be stably poured onto the wafer W through the outlet openings 45a, 45b and 45c. For example, each of the outlet openings 45a, 45b and 45c may be a slit of a length shorter than that of the outlet opening 62 for pouring the developer onto the wafer W in a band-shaped flow or may be a circular opening. Projection areas corresponding to the projections of the outlet openings 45a, 45b and 45c on the wafer W do not necessarily need to be circular or rectangular. Each of the secondary developer nozzles 42a, 42b and 42c may be provided with plural outlet openings.

Figure 10A:
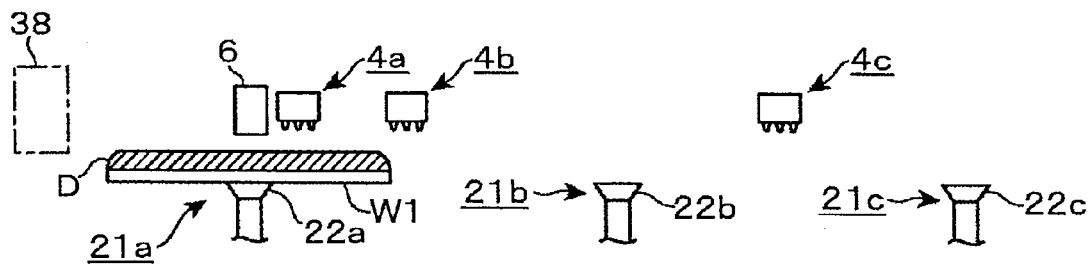
FIGS. 10A to 10D are views of assistance in explaining other developing steps to be executed by the developing apparatus shown in FIG. 1.
Figure 10B:
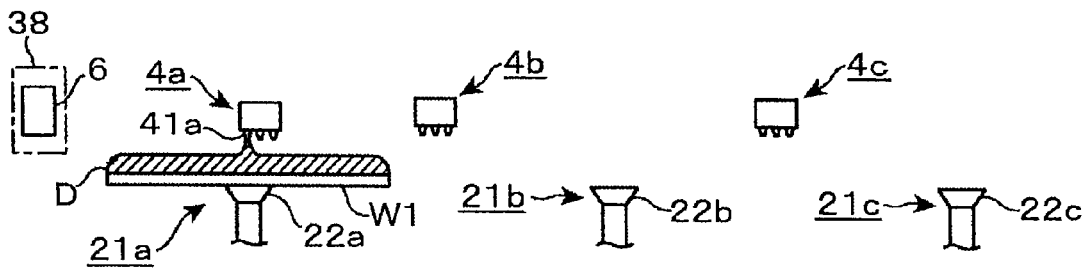
Figure 10C:
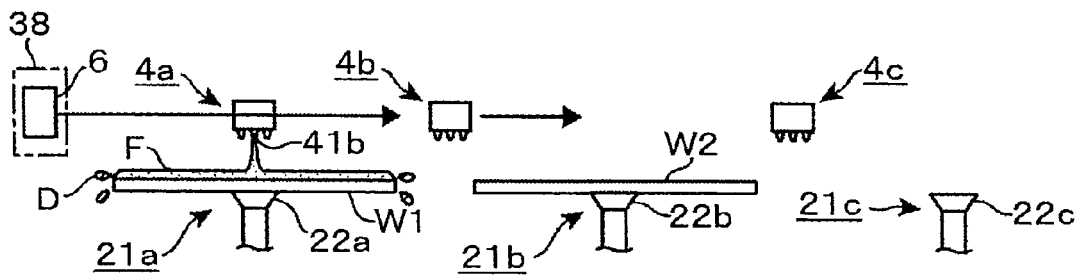
Figure 10D:
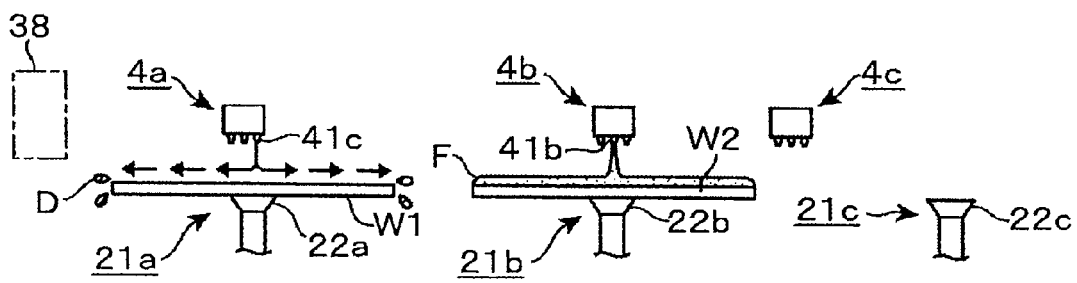

The main developer nozzle 6 does not necessarily need to be held waiting in a manner in which the foregoing embodiment holds the main developer nozzle 6 waiting. Another method of holding the main developer nozzle 6 waiting will be described with reference to FIG. 10. In the progress of the developing process like the progress of the developing process carried out by the foregoing embodiment, the main developer nozzle 6 pouring out the developer D is moved from a position corresponding to the circumference of the wafer W1 toward a position corresponding to a central part of the wafer W1 in the developing unit 21a. After stopping pouring the developer D through the main developer nozzle 6, the developer D is poured through the secondary developer nozzle 41a onto the wafer W1 and the main developer nozzle 6 is returned to the main developer nozzle holder 38 as shown in FIGS. 10A and 10B. When the wafer W2 is placed in the cup 25 of the developing unit 21b, the main developer nozzle 6 is moved from the main developer nozzle holder 38 to a position above the wafer W2 and the composite nozzle unit 4b is moved from the composite nozzle unit holder 37b to a position above the wafer W2 to start a developing process as shown in FIGS. 10C and 10D. Similarly, the wafers W2 and W3 carried to the developing units 21b and 21c, respectively, are subjected to the developer film forming process. Upon the completion of the developer film forming process, the main developer nozzle 6 is returned to the main developer nozzle holder 38. When a wafer W is carried into the cup 25 of any one of the developing units 21a, 21b and 21c thereafter, the main developer nozzle 6 is moved to the same cup 25. The effect of the movement of the main developer nozzle 6 in such a nozzle moving mode is the same as that of the foregoing embodiment. However, the nozzle moving mode in which the foregoing embodiment moves the main developer nozzle 6 is preferable because the main developer nozzle 6 can be more rapidly moved to the developing unit 21 to which a wafer W has been carried and, consequently, throughput can be increased.

Figure 11A:
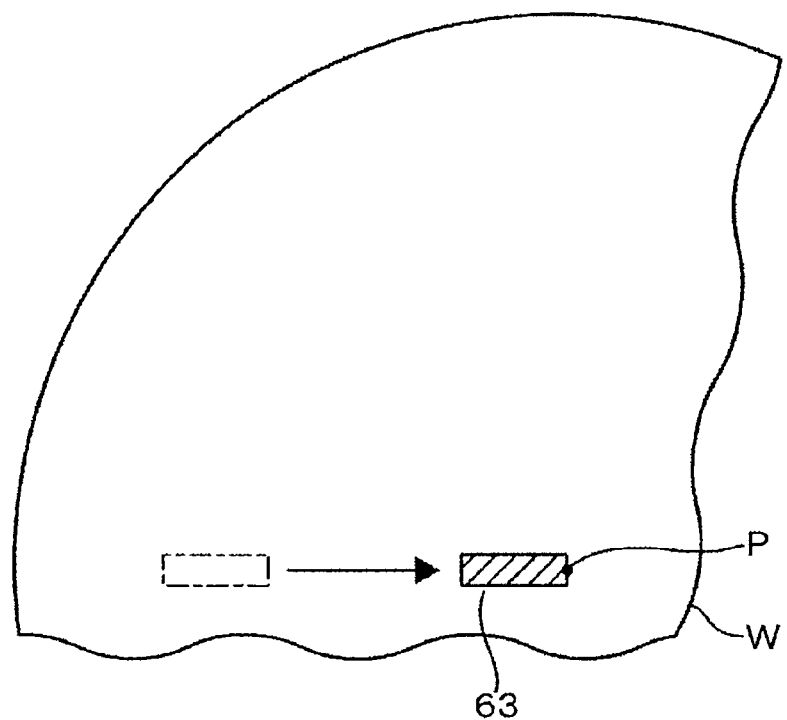
FIGS. 11A and 11B are diagrammatic views of assistance in explaining the movement of a projection area corresponding to the projection of the main developer nozzle.
Figure 11B:
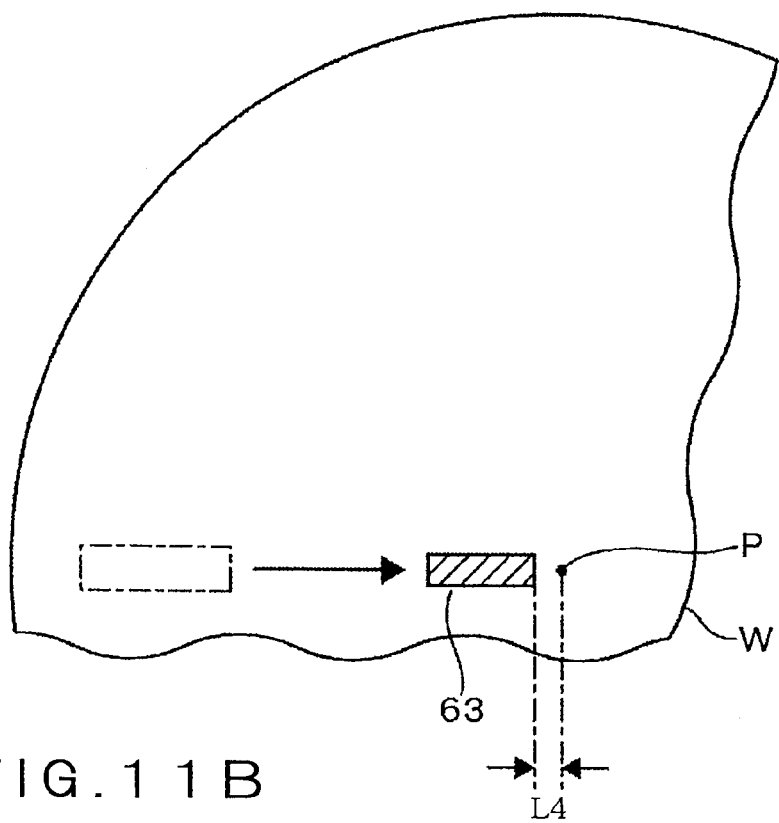

The foregoing embodiment may locate the main developer nozzle 6 to pour the developer onto the center P of a wafer W such that an end of the projection area 63 is at the center P of the wafer W as shown in FIG. 11A instead of locating the main developer nozzle 6 such that the projection area 63 contains the center P of the wafer W. The developer may be poured onto the wafer with the main developer nozzle 6 located such that an end of the projection area 63 is at a distance from the center P of the wafer W as shown in FIG. 11B so that the center P is wetted with the developer spreading on the wafer W. This pouring mode is included in a pouring mode of "pouring the developer onto a central part of a wafer W" as mentioned in the appended claims. In such a mode of pouring the developer, the distance L4 between the end of the projection area 63 and the center P is 10 mm or below. The foregoing embodiment thus constructed is preferable because repetitive pouring of the developer onto the central part of the wafer W can be avoided and the consumption of the developer can be reduced. The secondary developer nozzles 41a, 41b and 41c also may pour the developer with the projection areas 47a, 47b and 47c thereof not containing the center P of the wafer W when the developer poured onto the wafer W can spread over the center P of the wafer W.

When the foregoing embodiment moves the main developer nozzle 6 from the position corresponding to the circumference of the wafer W toward the central part of the wafer W to pour the developer in a spiral bead on the wafer W, the adjacent beads of the developer may overlap each other, may extend contiguously or may spaced apart from each other, provided that the developer poured on the wafer W spreads over the wafer W and coats the wafer W entirely with a film of the developer.

The developing apparatus may be provided with a single composite nozzle unit 4 like the single main developer nozzle 6 and may be used in common by the developing units 21a, 21b and 21c. However, it is preferable to provide the developing units 21a, 21b and 21c with composite nozzle units, respectively, to enable the developing units 21a, 21b and 21c to execute the developing process simultaneously and to increase through put.

Figure 12:
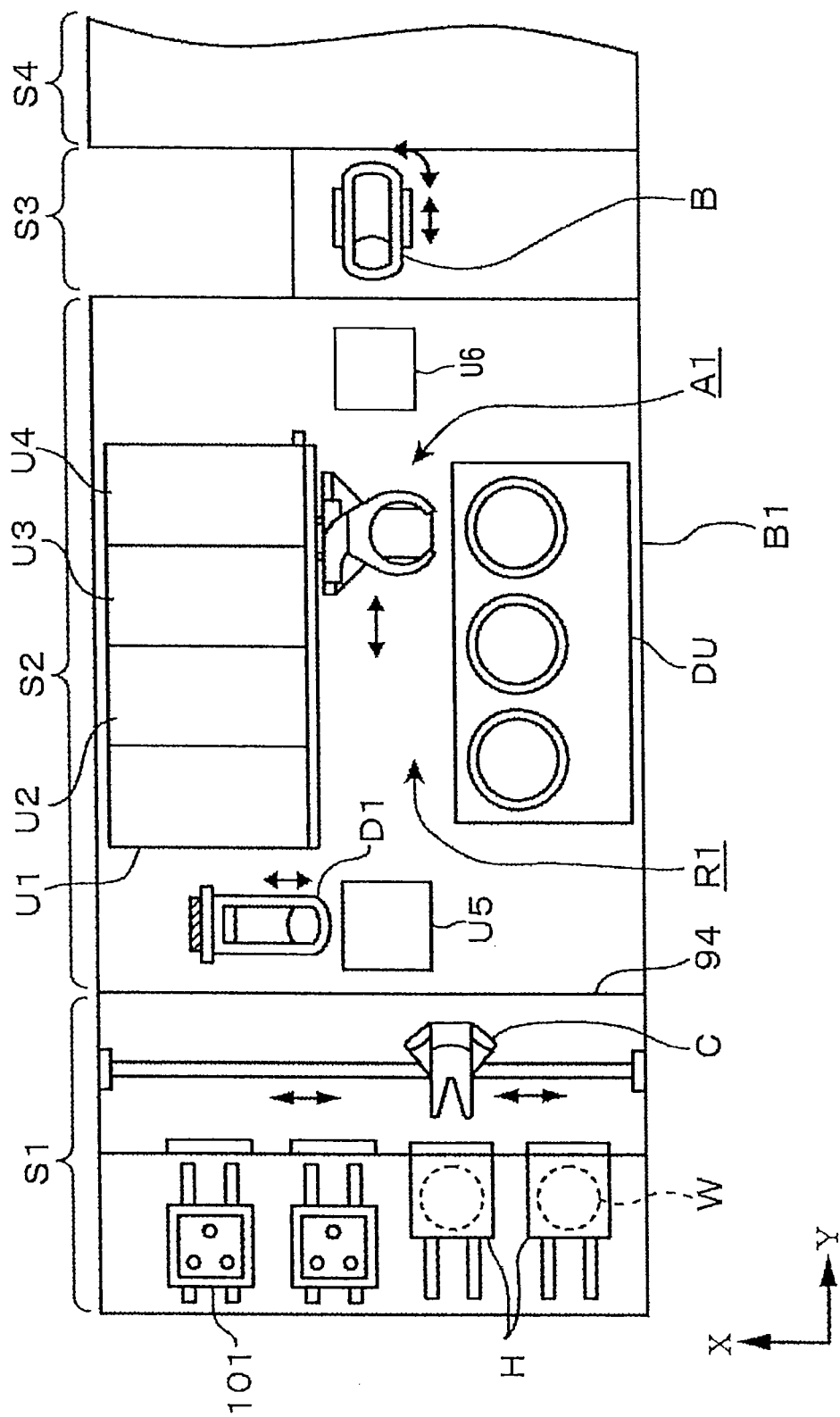
FIG. 12 is a plan view of a coating and developing system provided with the developing apparatus shown in FIG. 1.
Figure 13:
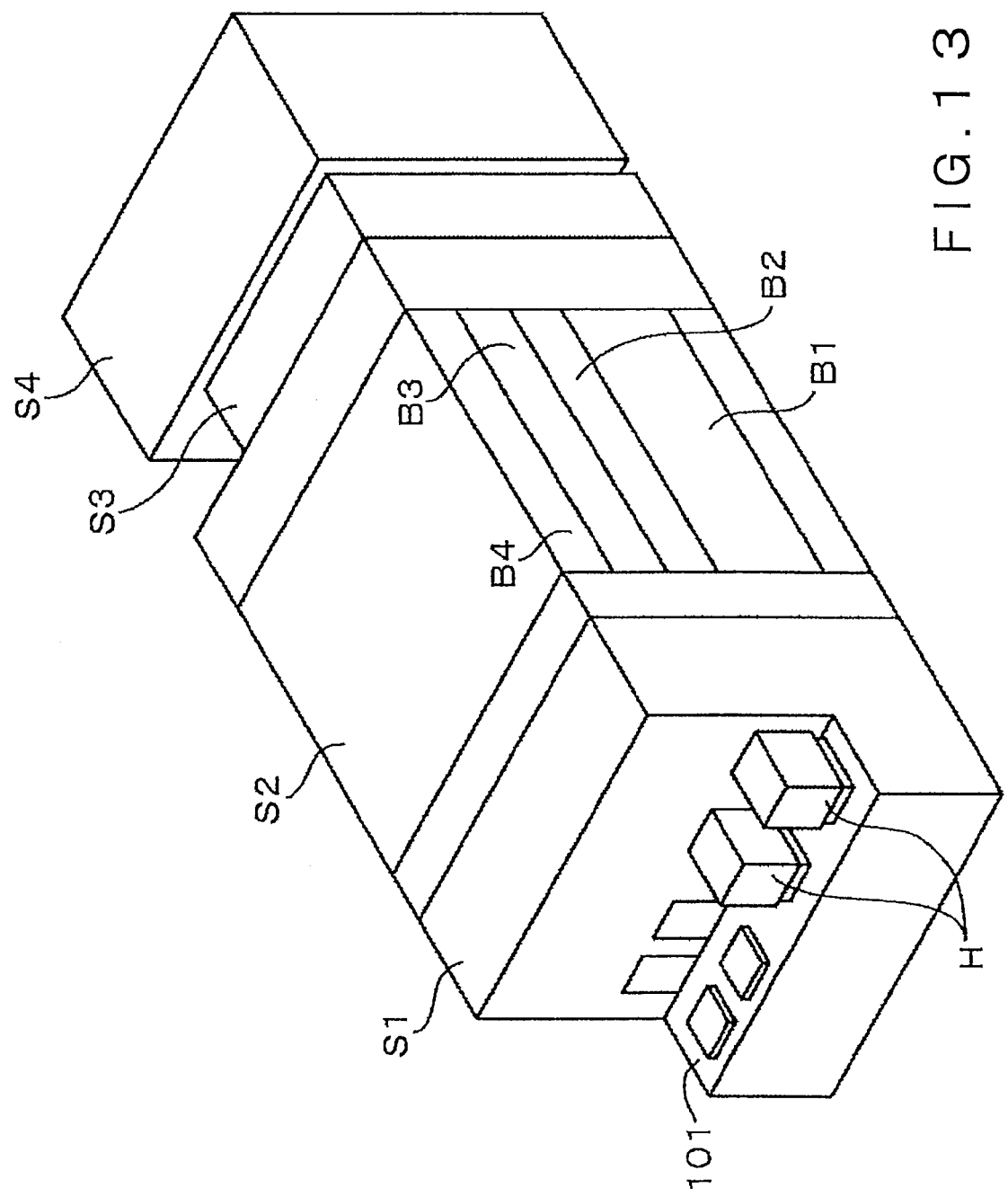
FIG. 13 is a perspective view of the coating and developing system shown in FIG. 12.
Figure 14:
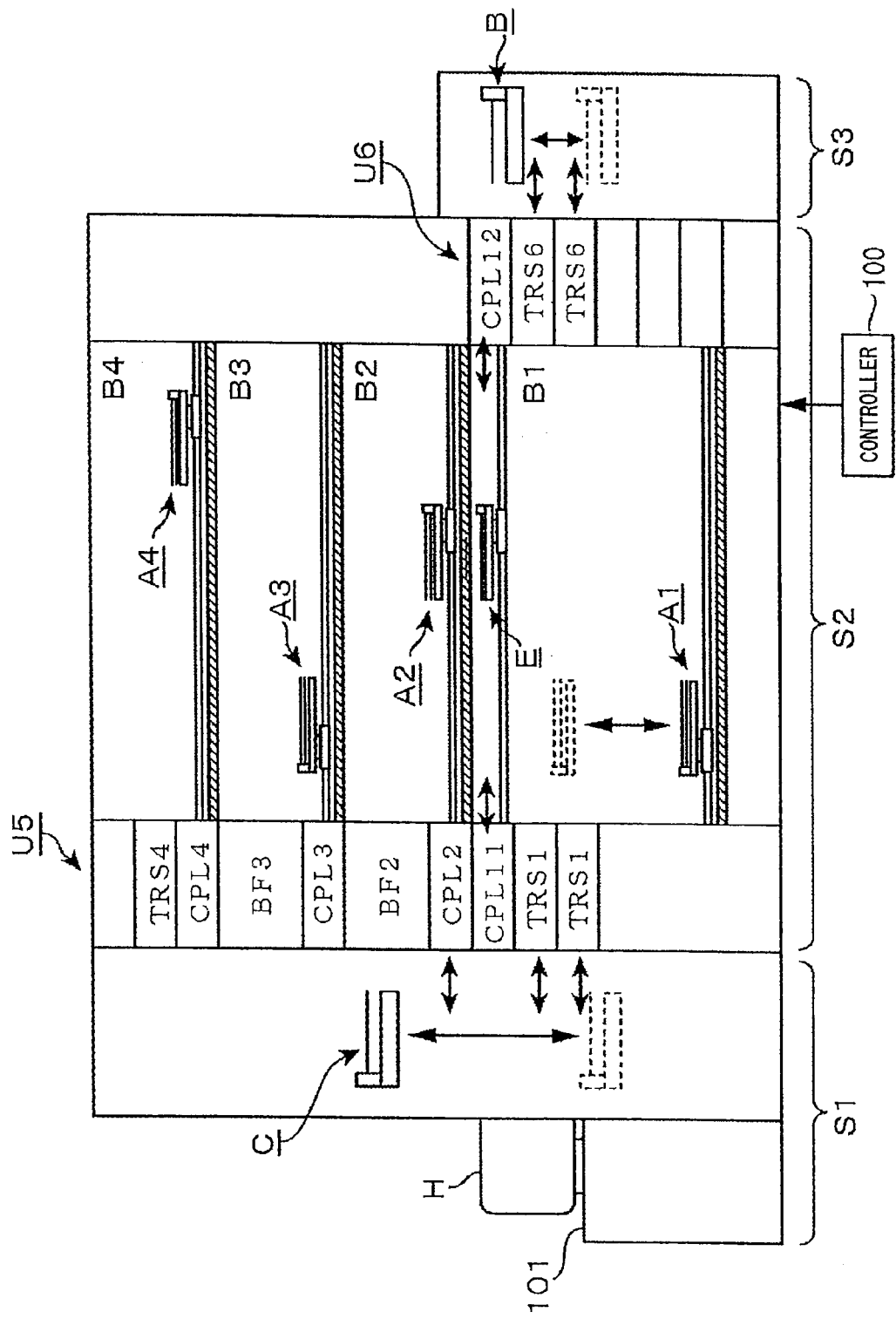
FIG. 14 is a longitudinal sectional view of the coating and developing system shown in FIG. 12.
Figure 15A:
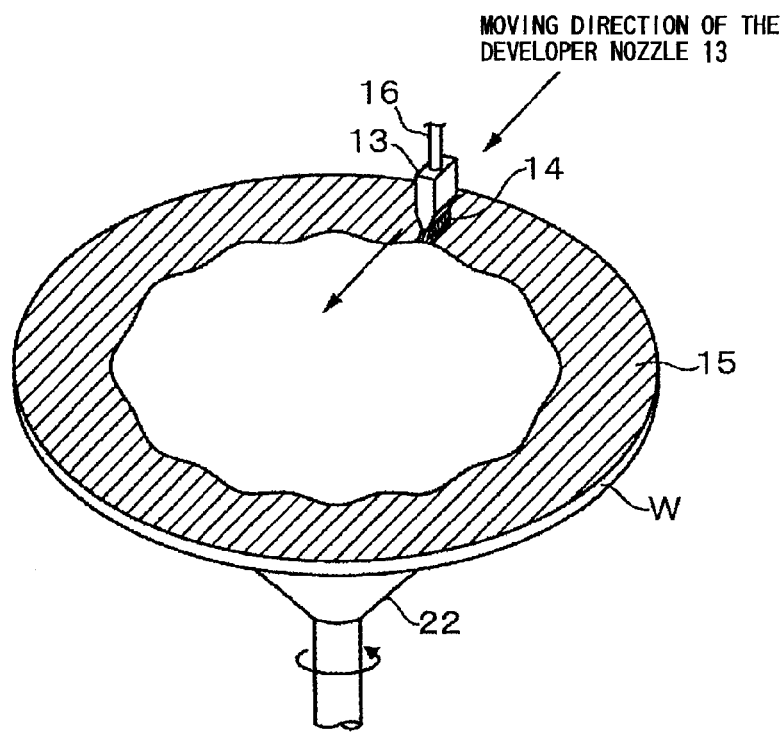
FIGS. 15A and 15B are a perspective view and a front elevation, respectively, of assistance in explaining a conventional developing method.
Figure 15B:
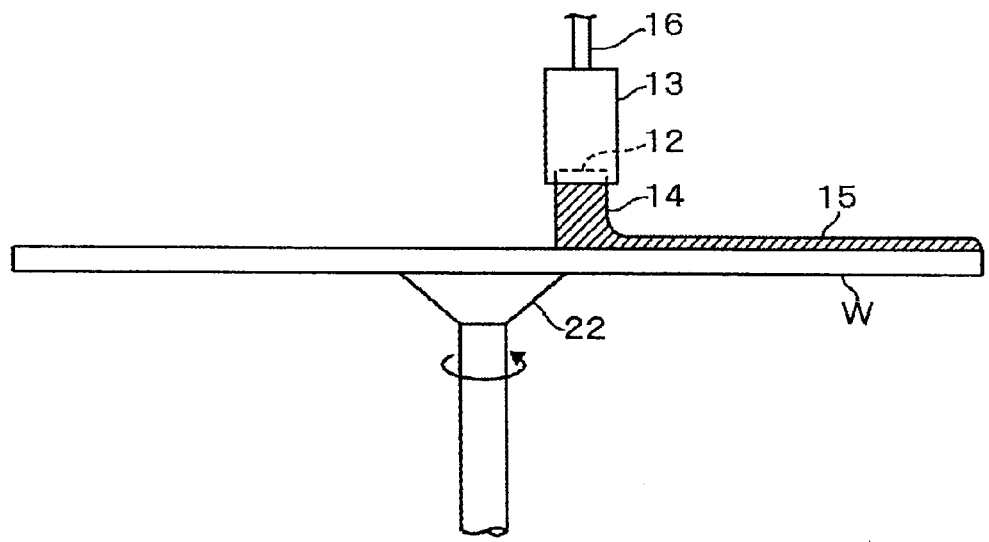

A coating and developing system provided with the foregoing developing apparatus 2 will be briefly described by way of example. FIG. 12 is a plan view of the coating and developing system combined with an exposure system, FIG. 13 is a perspective view of the coating and developing system and FIG. 14 is a longitudinal sectional view of the coating and developing system. The coating and developing system has a carrier block S1. A transfer arm C takes out a wafer W from an airtight carrier H placed on a carrier table 101 disposed in the carrier block S1 and transfers the wafer to a processing block S2. The transfer arm C receives a processed wafer W from the processing block S2 and returns the same to the carrier H.

As shown in FIG. 13, the processing block S2 of this coating and developing system has a first processing layer (DEV layer) B1 that carries out a developing process, a second processing layer (BCT layer) B2 that carries out an antireflection film forming process for forming an antireflection film underlying a resist film, a third processing layer (COT layer) B3 that carries out a coating process for forming a resist film, and a fourth processing layer (TCT layer) B4 that carries out an antireflection forming process for forming an antireflection film overlying a resist film stacked upward in that order.

Each of the second processing layer (BCT layer) B2 and the fourth processing layer (TCT layer) B4 has a coating unit that carries out a coating process for forming a an antireflection film by spreading a chemical solution on a wafer W by a spin coating method, a group of heating and cooling units that carries out a pretreatment process before the coating process and a posttreatment process after the coating process, and carrying arms A2 and A4 disposed between the coating unit and the group of the processing units to carry a wafer W between the coating unit and the group of the processing units. The third processing layer (COT layer) B3 is the same in construction as the second processing layer B2 and the fourth processing layer B4, except that the third processing layer B3 uses a resist solution as a chemical solution.

In the first processing layer (DEV layer) B1, two developing units DU are stacked in two layers. Each of the developing units DU is the foregoing developing apparatus 2. The DEV layer B1 is provided with a carrying arm A1 for carrying a wafer to the developing units DU stacked in two layers. Thus the carrying arm A1 is used in common by the two developing units DU.

Referring to FIGS. 12 and 14, a shelf unit U5 is installed in the processing block S2. Wafers W are transferred from the carrier block S1 to one of transfer units of the shelf unit U5, for example, a transfer unit CPL2 corresponding to the second layer (BCT layer)B2. Then, a vertically movable transfer arm D1 disposed near the shelf unit U5 carries the wafers W sequentially. The carrying arm A2 installed in the second processing layer (BCT layer) B2 receives the wafer W from the transfer unit CPL2 and carries the wafer W to the units, namely, the antireflection film forming units and the group of the heating and cooling units to form an antireflection film on the wafer W by those units.

Subsequently, the wafer W is transferred through a transfer unit BF2 of the shelf unit U5, the transfer arm D1, a transfer unit CPL3 of the shelf unit U5 and the carrying arm A3 to the third processing layer (COT layer) B3 to form a resist film on the wafer W. Then, the wafer W is transferred through the carrying arm A3, a transfer unit BF3 of the shelf unit U5 and the transfer arm D1 to a transfer unit CPL11 of the shelf unit U5. In some cases, an antireflection film is formed on the resist film formed on the wafer W by the fourth processing layer (TCT layer) B4. In such a case, the wafer W is transferred through a transfer unit CPL4 to the carrying arm A4, and the carrying arm A4 carries the wafer W provided with another antireflection film to a transfer unit TRS4.

A shuttle arm E is installed in an upper part of the DEV layer B1 specially for directly carrying a wafer W from the transfer unit CPL11 of the shelf unit U5 to a transfer unit CPL12 of a shelf unit U6. The transfer arm D1 receives the wafer W coated with the resist film and the antireflection film from the transfer units BF3 and TRS4 and transfers the wafer W to the transfer unit CPL11. Then, the shuttle arm E carries the wafer W from the transfer unit CPL11 directly to the transfer unit CPL12 of the shelf unit 6, and the wafer W is transferred to an interface block S3. In FIG. 14, transfer units designated by "CPL" serve also as a cooling unit for temperature adjustment, and the transfer units designated by "BF" serve also as buffer units capable of holding plural wafers W.

Subsequently, an interface arm B carries the wafer W to the exposure system S4 that carries out, for example, an immersion exposure process. The wafer W processed by a predetermined exposure process is returned through a transfer unit TRS6 of the shelf unit U6 to the processing block S2. Then, the wafer W is subjected to a developing process in the first layer (DEV layer) B1. Then, the carrying arm A1 carries the wafer W processed by the developing process to a transfer unit TRS1 of the shelf unit U5. Then, the transfer arm C returns the wafer W to the carrier H. Indicated at U1 to U4 in FIG. 12 are groups of thermal units each built by stacking a heating unit and a cooling unit.

What is claimed is:

1. A developing apparatus comprising:
   plural transversely arranged developing units each provided with a substrate holding device for holding a substrate coated with a resist and processed by an exposure process in a horizontal position and rotating the substrate;
   a first developer nozzle to be used in common by the plural developing units to pour a developer in a band-shaped flow onto a substrates held by each of the substrate holding devices;
   a nozzle driving mechanism for carrying the first developer nozzle from one to another of the developing units, and moving the first developer nozzle with one end of a band-shaped area into which the developer is to be poured through the first developer nozzle directed toward the center of the substrate in each of the developing units such that a part in a surface of the substrate onto which the developer is poured moves from a central part toward a peripheral part or from a peripheral part toward a central part in the surface of the substrate to coat the surface of the substrate entirely with a developer film; and
   second developer nozzles for pouring the developer into a circular area or a band-shaped area of a short length shorter than that of the band-shaped area into which the first developer nozzle pours the developer in a central part of the substrate on which the developer film has been formed by the first developer nozzle to prevent the developer film from drying.

2. The developing apparatus according to claim 1, wherein the plural second developer nozzles are combined respectively with the substrate holding devices and operate individually to pour the developer in the corresponding substrate holding devices, respectively.

3. The developing apparatus according to claim 2, wherein the first developer nozzle is provided with a flat first outlet opening.

4. The developing apparatus according to claim 2, wherein the second developer nozzle is provided with a substantially circular outlet opening.

5. The developing apparatus according to claim 2 further comprising a controller for controlling rotation of the substrate holding devices, movement of the first developer nozzle, and pouring the developer through the first developer nozzle and the second developer nozzles.

6. The developing apparatus according to claim 5, wherein the controller makes the first developer nozzle pour the developer in one of the developing units, moves the first developer nozzle to another developing unit, hold the first developer nozzle waiting in another developing unit, and then makes the first developer nozzle pour the developer onto a substrate in another developing unit.

7. The developing apparatus according to claim 2, wherein the developer is poured through the second developer nozzle at a pouring rate lower than that at which the developer is poured through the first developer nozzle.

8. The developing apparatus according to claim 1, wherein the first developer nozzle is provided with a flat first outlet opening.

9. The developing apparatus according to claim 8 further comprising a controller for controlling rotation of the substrate holding devices, movement of the first developer nozzle, and pouring the developer through the first developer nozzle and the second developer nozzles.

10. The developing apparatus according to claim 1, wherein each of the second developer nozzles is provided with a substantially circular second outlet opening.

11. The developing apparatus according to claim 10 further comprising a controller for controlling rotation of the substrate holding devices, movement of the first developer nozzle, and pouring the developer through the first developer nozzle and the second developer nozzles.

12. The developing apparatus according to claim 1 further comprising a controller for controlling rotation of the substrate holding devices, movement of the first developer nozzle, and pouring the developer through the first developer nozzle and the second developer nozzles.

13. The developing apparatus according to claim 12, wherein the controller makes the first developer nozzle pour the developer in one of the developing units, moves the first developer nozzle to another developing unit, hold the first developer nozzle waiting in another developing unit, and then makes the first developer nozzle pour the developer onto a substrate in another developing unit.

14. The developing apparatus according to claim 1, wherein the developer is poured out through each of the second developer nozzles at a pouring rate lower than that at which the developer is poured out through the first developer nozzle.

15. A developing method comprising the steps of:
   holding plural substrates each coated with a resist and processed by an exposure process respectively by plural substrate holding devices respectively installed in transversely arranged developing units;

pouring a developer in a band-shaped flow onto either of a central and a peripheral part of a surface of the substrate held and being rotated by the substrate holding device with one end of a band-shaped area into which the developer is to be poured through the first developer nozzle directed toward the center of the substrate;

forming a developer film on the surface of the substrate by moving a position on the surface of the substrate at which the developer is poured from a central part toward a peripheral part or from a peripheral part toward a central part of the surface of the substrate with one end of the band-shaped area into which the developer is poured through the first developer nozzle directed toward the center of the substrate;

preventing the developer film from drying by pouring the developer through one of second developer nozzles into a circular area or a band-shaped area of a short length shorter than that of the band-shaped area into which the first developer nozzle pours the developer in a central part of the substrate on which the developer film has been formed by the first developer nozzle, and rotating the substrate holding device holding the substrate about a vertical axis to spread the developer toward a circumference of the substrate by centrifugal force;

moving the first developer nozzle from one to another one of the developing units; and carrying out the steps of pouring the developer and preventing a developer film from drying for the substrate held by another substrate holding device.

16. The developing method according to claim 15, wherein the second developer nozzles are combined respectively with the plural substrate holding devices, and the second developer nozzles operate individually to pour the developer onto the substrates held by the substrate holding devices.

17. The developing apparatus according to claim 16, wherein the developer is poured out through each of the second developer nozzles at a pouring rate lower than that at which the developer is poured out through the first developer nozzle.

18. The developing method according to claim 15, wherein the developer is poured out through each of the second developer nozzles at a pouring rate lower than that at which the developer is poured out through the first developer nozzle.

19. A storage medium storing a computer program for a developing apparatus that processes a substrate coated with a resist and processed by an exposure process by a developing process to execute;

wherein the computer program includes a set of instructions for carrying out the developing method set forth in claim 15.

* * * * *